United States Patent [19]
Dister et al.

[11] Patent Number: 6,041,287
[45] Date of Patent: *Mar. 21, 2000

[54] SYSTEM ARCHITECTURE FOR ON-LINE MACHINE DIAGNOSTICS

[75] Inventors: Carl J. Dister, North Olmsted; Frederick M. Discenzo, Brecksville, both of Ohio

[73] Assignee: Reliance Electric Industrial Company, Cleveland, Ohio

[*] Notice: This patent is subject to a terminal disclaimer.

[21] Appl. No.: 09/073,505

[22] Filed: May 6, 1998

Related U.S. Application Data

[63] Continuation-in-part of application No. 08/745,167, Nov. 7, 1996, Pat. No. 5,917,428, and application No. 08/988,177, Dec. 10, 1997.

[51] Int. Cl.⁷ ..................................................... G01F 1/56
[52] U.S. Cl. ........................................... 702/182; 702/183
[58] Field of Search .......................... 702/57, 66, 33–35, 702/56, 182, 183–185, 189, 81

[56] References Cited

U.S. PATENT DOCUMENTS

| | | |
|---|---|---|
| Re. 34,159 | 1/1993 | Harrington et al. . |
| 3,839,628 | 10/1974 | Higgins et al. . |
| 4,057,714 | 11/1977 | Fork et al. . |
| 4,063,112 | 12/1977 | Dumbeck . |
| 4,194,178 | 3/1980 | Dumbeck . |
| 4,277,772 | 7/1981 | Kastura et al. . |
| 4,292,670 | 9/1981 | Reid et al. ................................ 702/44 |
| 4,402,054 | 8/1983 | Osborne et al. ........................ 702/185 |
| 4,408,294 | 10/1983 | Imam . |
| 4,694,390 | 9/1987 | Lee . |
| 4,748,843 | 6/1988 | Schafer et al. . |
| 4,896,101 | 1/1990 | Cobb . |
| 4,965,513 | 10/1990 | Haynes et al. . |
| 5,003,490 | 3/1991 | Castelaz et al. . |
| 5,049,815 | 9/1991 | Kliman . |
| 5,223,207 | 6/1993 | Gross et al. ............................ 702/113 |
| 5,270,640 | 12/1993 | Kohler et al. ........................... 324/772 |
| 5,313,407 | 5/1994 | Tiernan et al. . |
| 5,329,465 | 7/1994 | Arcella et al. . |
| 5,400,246 | 3/1995 | Wilson et al. . |
| 5,416,399 | 5/1995 | Brunson . |
| 5,419,197 | 5/1995 | Ogi et al. . |
| 5,461,329 | 10/1995 | Linehan et al. . |
| 5,481,481 | 1/1996 | Frey et al. ................................ 702/82 |
| 5,485,491 | 1/1996 | Salnick et al. . |

(List continued on next page.)

OTHER PUBLICATIONS

Computer Applications in Power; vol. 4, No. 3, Jul. 1991, "User Interface Graphically Improves Generator AI Diagnostics" by Robert F. Gray and Ian J. King, pp. 16–20.

ASME, Design, Repair, and Refurbishment of Steam Turbines, presented at The 1991 Int'l. Joint Power Generation Conference Oct. 6–10, 1991, San Diego, CA, "On–Line Diagnostics and Monitors for the 1990s" by R. L. Osborne, et al., pp. 29–36.

Hydrocarbon Processing, Apr. 1997, vol. 76, No. 4, "HP Innovations" selected by Les Kane, et al.

*Primary Examiner*—Marc S. Hoff
*Assistant Examiner*—Craig Steven Miller
*Attorney, Agent, or Firm*—Himanshu S. Amin; John M. Miller; John J. Horn

[57] ABSTRACT

A machine diagnostic system is provided which includes a host computer for determining a health state of a machine. The host computer is operatively coupled to a network backbone. The system also includes a machine diagnostic module adapted to be integrally mounted to a machine, the machine diagnostic module being operatively coupled to the network backbone. The machine diagnostic module collects data relating to operation of the machine and preprocesses the data, and the host computer analyzes the preprocessed data in determining the health state of the machine. The machine diagnostic system includes a system architecture which facilitates the machine diagnosis. The system architecture includes several software layers which provide for collecting and preprocessing machine data, transmitting the collected and/or preprocessed data over a network and analyzing such for machine diagnosis and process diagnosis.

36 Claims, 35 Drawing Sheets

U.S. PATENT DOCUMENTS

| | | |
|---|---|---|
| 5,499,196 | 3/1996 | Pacheco . |
| 5,508,633 | 4/1996 | Rivera . |
| 5,512,883 | 4/1996 | Lane, Jr. . |
| 5,530,343 | 6/1996 | Bowers, III et al. . |
| 5,534,759 | 7/1996 | Evans et al. . |
| 5,571,969 | 11/1996 | Kawasaki . |
| 5,574,387 | 11/1996 | Petsche et al. . |
| 5,576,632 | 11/1996 | Petsche et al. . |
| 5,579,232 | 11/1996 | Tong et al. . |
| 5,602,708 | 2/1997 | Felgenhauer . |
| 5,612,629 | 3/1997 | Mullin et al. . |
| 5,629,870 | 5/1997 | Farag et al. . |
| 5,633,800 | 5/1997 | Bankert et al. ............... 702/33 |
| 5,640,103 | 6/1997 | Petsche et al. . |
| 5,684,718 | 11/1997 | Jenkins et al. ............... 702/57 |
| 5,726,911 | 3/1998 | Canada et al. . |

Motor #1

Torque = 5 ft/lbs
Speed = 1800 RPM

Fig. 3

Motor #1
Torque = 5 ft/lbs
Speed = 1800 RPM

Motor #2
Torque = 4.5 ft/lbs
Speed = 1810 RPM

Motor #3
Torque = 5 ft/lbs
Speed = 1800 RPM

Motor #4
Torque = 6 ft/lbs
Speed = 1900 RPM

Fig. 4

Motor #1

TEMP = 130°C

TEMP$_{normal}$ = 130°C

TEMP$_{max}$ = 180°C

48

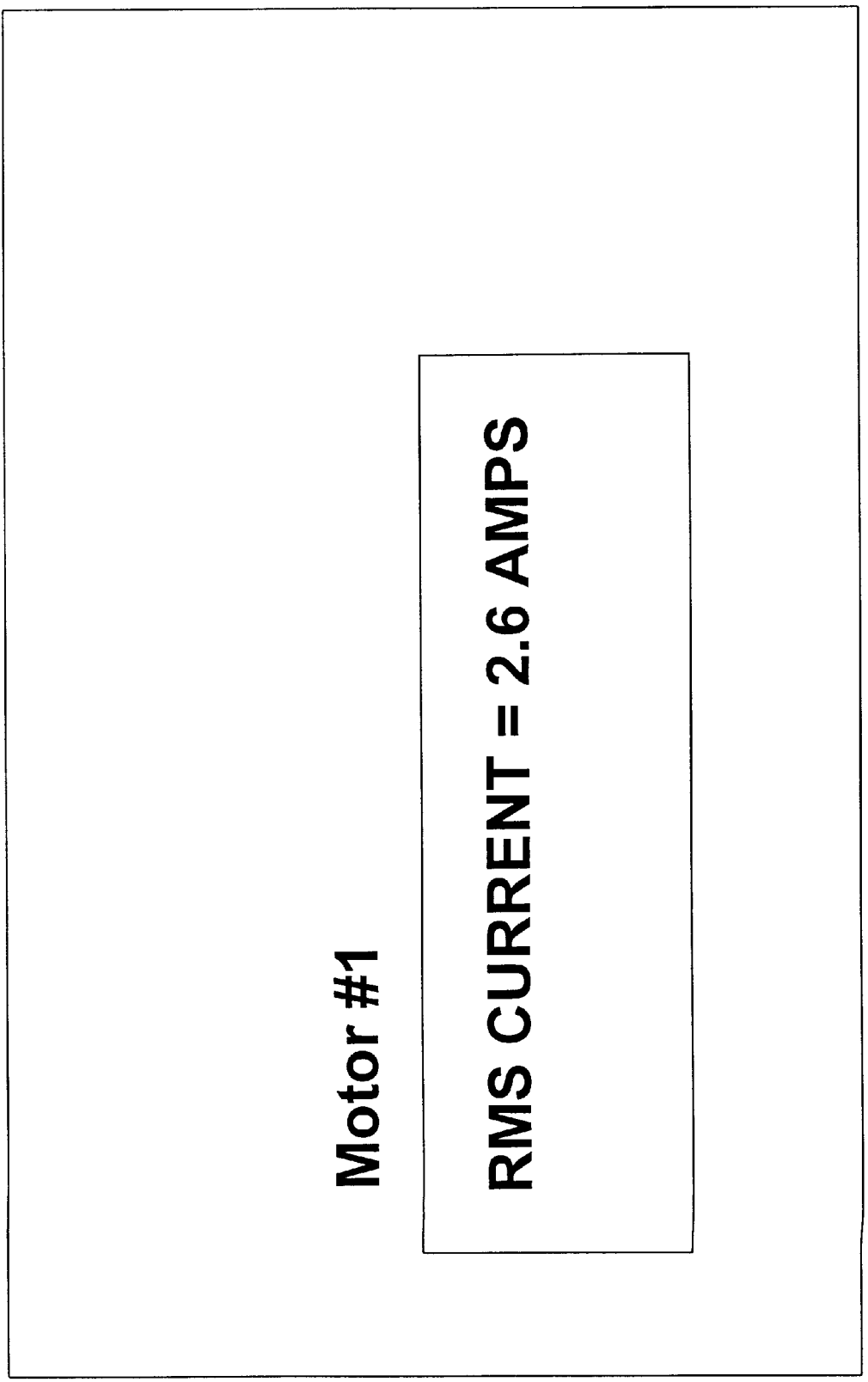

Motor #1

Positive Sequence = 2.6 AMPS

Negative Sequence = 0.001 AMPS

Fig. 8

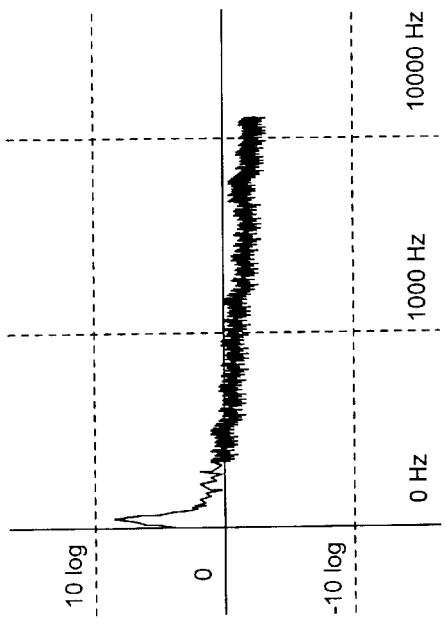
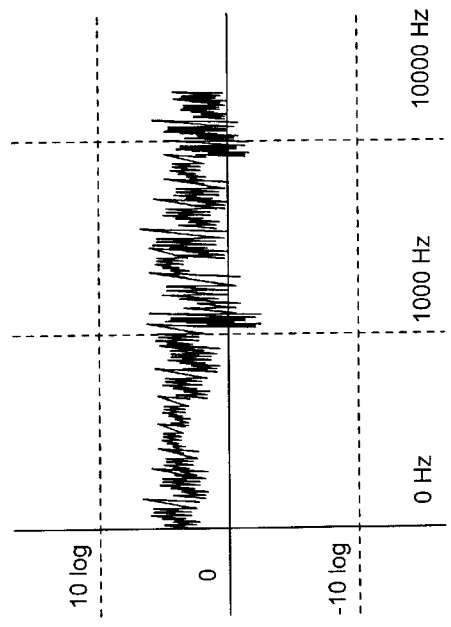
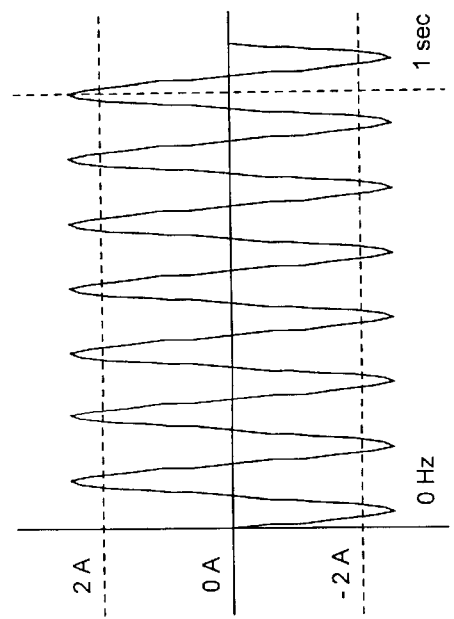
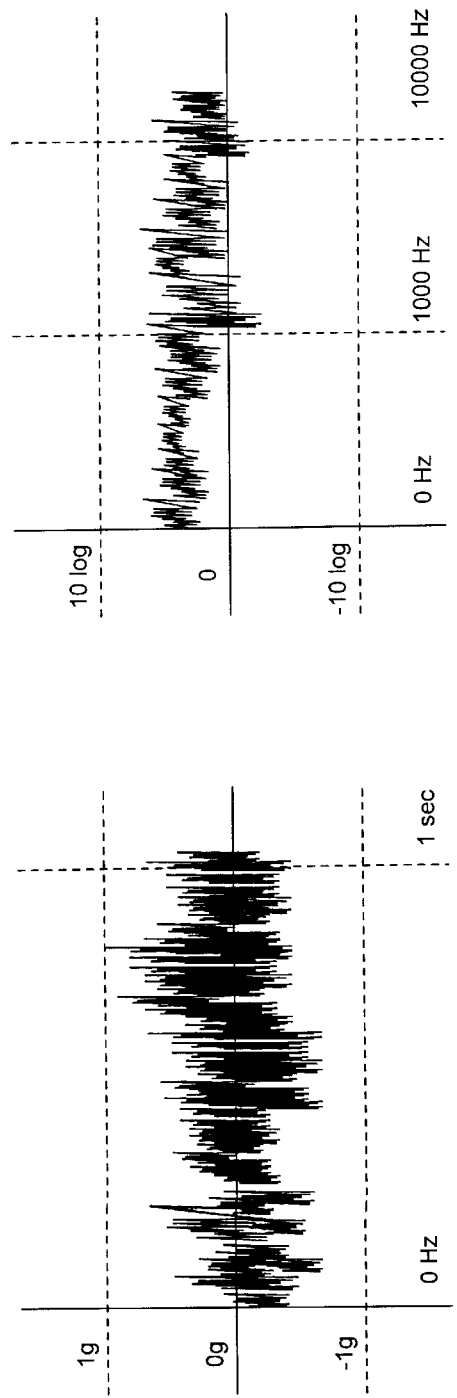
Fig. 21a
Fig. 21b
Fig. 21c
Fig. 21d

| | $f_0$ | $f_1$ | $f_2$ | $f_3$ | $f_4$ | • | • | • | $f_n$ | |
|---|---|---|---|---|---|---|---|---|---|---|
| | $A_3$ | $A_{34}$ | $A_{67}$ | $A_{78}$ | $A_{84}$ | • | • | • | $A_K$ | HEALTHY MOTOR |
| | $A_{34}$ | $A_{-68}$ | $A_{-90}$ | $A_{-65}$ | $A_{45}$ | • | • | • | $A_H$ | HEALTHY MOTOR |
| | $A_{56}$ | $A_{45}$ | $A_{45}$ | $A_{56}$ | $A_{78}$ | • | • | • | $A_X$ | BAD BEARING |
| | $A_{-23}$ | $A_{45}$ | $A_7$ | $A_{90}$ | $A_{12}$ | • | • | • | $A_Z$ | CRACKED ROTOR |
| | $A_{67}$ | $A_{36}$ | $A_3$ | $A_{45}$ | $A_{47}$ | • | • | • | $A_X$ | INSULATION PROBLEM |
| | $A_{78}$ | $A_{67}$ | $A_{12}$ | $A_{67}$ | $A_{37}$ | • | • | • | $A_C$ | HEALTHY MOTOR |
| | $A_{234}$ | $A_{27}$ | $A_{478}$ | $A_{24}$ | $A_{127}$ | • | • | • | $A_Q$ | BAD BEARING |
| | $A_{-98}$ | $A_{78}$ | $A_{26}$ | $A_{12}$ | $A_{128}$ | • | • | • | $A_B$ | CRACKED CASING |
| | $A_{26}$ | $A_{96}$ | $A_{83}$ | $A_{56}$ | $A_{234}$ | • | • | • | $A_M$ | LUBRICATION PROBLEM |
| | $A_4$ | $A_{32}$ | $A_{187}$ | $A_{56}$ | $A_{34}$ | • | • | • | $A_I$ | BAD INNER RACE |
| | $A_0$ | $A_{16}$ | $A_{73}$ | $A_{76}$ | $A_{33}$ | • | • | • | $A_E$ | BAD OUTER RACE |
| | $A_{75}$ | $A_{17}$ | $A_{45}$ | $A_{69}$ | $A_{44}$ | • | • | • | $A_Q$ | BAD BALL SURFACE |

SYSTEM ARCHITECTURE FOR ON-LINE MACHINE DIAGNOSTICS

CROSS-REFERENCE TO RELATED PATENT APPLICATION(S)

This application is a continuation-in-part of U.S. patent application Ser. No. 08/745,167 filed on Nov. 7, 1996 entitled INTEGRATED MOTOR AND DIAGNOSTIC APPARATUS AND METHOD OF OPERATING SAME now U.S. Pat. No. 5,917,428; and a continuation-in-part of U.S. patent application Ser. No. 08/988,177 filed on Dec. 10, 1997 entitled DYNAMOELECTRIC MACHINE DIAGNOSTIC MODULE now pending. Both of these patent applications are incorporated herein by reference in their entirety.

TECHNICAL FIELD

The present invention generally relates to a system architecture for on-line diagnosis of the health of a dynamoelectric machine.

BACKGROUND OF THE INVENTION

Dynamoelectric machines such as motors and generators are widely employed in industrial and commercial facilities. These machines are relied upon to operate with minimal attention and provide for long, reliable operation. Many facilities operate several hundreds or even thousands of such machines concurrently, many of which are integrated into a large interdependent process or system. Like most machinery, at least a small percentage of such motors are prone to failure. The majority of such failures can be attributed to either mechanical failures and/or thermal failures of the machine insulation.

Other than normal aging, failures are typically due to: poor or no maintenance; improper application (e.g., wrong enclosure, excessive loading, etc.); and improper installation (e.g., misalignment, bad power, inverter mismatch, etc.). Even with normal aging failures, it is desirable to provide reliable failure prediction information for such machines.

Depending on the application, the failure of a machine in service can possibly lead to system or process down time, inconvenience, and possibly even a hazardous situation. Thus, it desirable to diagnose the machinery for possible failure or faults early in order to avoid such problems. Absent special monitoring for certain motor problems, the problems may have an insidious effect in that although only a minor problem on the onset the problem could become serious if not detected. For example, insulation problems and electrical problems may not become apparent until irreversible damage has resulted. Likewise, bearing problems due to inadequate lubrication, contamination or other causes may not become apparent until irreversible damage has occurred.

Typically, to perform machine preventive maintenance, maintenance rounds are conducted where a maintenance person or vibration specialist will go to each critical machine in the plant and couple a portable recorder to each machine to measure vibrations of the machine. Vibration analysis is the established technique for determining the health of mechanical components in rotating machinery such as induction motors. The analysis of the vibration signals taken at various times is dependent on the ability to reproduce the precise location and direction of mounting of the sensor (i.e., recorder). Consequently, portable recorders are deficient in obtaining reliable vibration data as compared to accelerometers permanently installed on the motor to be monitored.

Other types of portable recorders employed for collecting data relevant to motor health are ones that collect motor flux data, motor current data and/or motor temperature data. Many such portable recorders experience problems with consistency in data recovery because of the inherent difficulty associated with placing the portable recorder in the exact same position as when the previous recording was taken.

Another method for obtaining data relating to the health of the motor is to mount current sensors (in the motor control cabinet) to the power lines feeding the motor. The current sensors collect current data which is used in current signature analysis to assess the health of the motor. However, intimate knowledge of the motor is generally required in order to conduct a thorough motor current signature analysis. But, many manufacturers of current signature analysis equipment do not have intimate knowledge of the motors that are to be analyzed with their equipment. Simply knowing the motor horsepower and line voltage is not sufficient for performing good current signature analysis. Rather, intimate details about the motor such as the number of rotor bars, rotor construction, the number of turns on the stator winding, windage and friction losses, etc. are needed. Generally, only the actual designer of the motor has such intimate information. Thus, current signature analysis devices fabricated by those other than the motor designer oftentimes result in inferior diagnostics because they are missing important motor design information. Consequently, the best such devices can do typically is provide general guidelines for spectral peaks within relatively broad frequency ranges and try to trend from sample to sample. Additionally, such current sensor devices located in the motor cabinets cannot monitor for vibration and temperature which are two important indicators of the health of the motor. In particular, mechanical problems of a motor usually are manifested most prominently via vibrations. Thus vibration analysis is still the desired method for analyzing a machine for mechanically related problems.

Furthermore, because such monitoring typically takes place at the motor, motor diagnosis related thereto may require large amounts of manpower to collect the data and then provide a remote computer with the data to perform analyses thereon. Moreover, such manual intensive methods are not amenable to performing trend analysis.

In view of the above, there is a need for an integrated dynamometric machine diagnostic device which affords for measuring vibration, current, temperature, voltage, shaft position and other parameters relating to the health of the machine. Furthermore, it would be desirable to have such a diagnostic device which also has stored therein detailed design information of the machine it is operatively coupled to. Moreover, it would be desirable to have such a diagnostic device be part of a distributed machine diagnosis system so as to allow for on-line monitoring of a plurality of machines.

SUMMARY OF THE INVENTION

The present invention relates to a system for on-line machine diagnosis. The architecture of the system affords for the ability to communicate with a machine automatically on-line through a distributed network. As a result, data collections can be scheduled and the data moved to a memory where software tools can easily access the data to perform machine diagnostics and trend analysis—the present invention can also be event triggered.

The system architecture includes a plurality of software based layers which facilitate performing on-line machine diagnosis. The first layer is an IQ Analyzing Layer which executes algorithms relating to machine data. The IQ Analyzing layer affords for selecting from a plurality of analysis tools to be employed on the collected motor data. For example, analysis may be based upon (1) torque and speed; (2) temperature; (3) signal processing; (4) RMS; (5) Fast Fourier Transforms (FFT); and (6) positive & negative sequence (e.g., sequence analysis is performed by taking the 3-phase power and decompressing it into positive and negative sequences in order to provide a goodness measurement of power). Thus, the IQ Analyzing Layer provides for applying one or a number of the above-identified analysis schemes to facilitate motor diagnosis.

The next level is the IQ Communicate layer which includes communications software which allows for interfacing with a plurality of types of machines according to their respective communications protocol. For example, if the machine is employing a DeviceNet protocol the IQ Communicate layer allows for interfacing using a DeviceNet protocol. Other protocols which the IQ Communications layer is adaptable to handle include: RS 232; Data Highway; PLC; Ethernet; Field Bus, etc. The IQ Communicate Layer may be predesigned for a given communications protocol, or alternatively the IQ Communicate Layer may be designed to be smart so that a particular communications protocol being used can be identified and the Communicate Layer adapt to communicate using that protocol. The IQ Communicate Layer writes diagnostic data obtained from the machine via the IQ Analyzer Layer to a System Memory (e.g., hard disk).

At a higher level is the IQ Expert layer which interprets and graphs the diagnostic data. A display is operatively coupled to this layer to display the data and interpretations thereof in a desired human readable manner (e.g., 3-dimensional graphics). The IQ Expert layer can analyze the data collected (e.g., analyze all three phases of current and voltage, analyze FFTs) and make a determination as to the health of the motor (e.g., stator fault) based on its expert analysis. This layer also provides for selecting from viewing single data or trending multiple data sets.

An even higher level layer may be employed which is a Process Analyzing layer. This layer integrates a plurality of IQ Expert and Analyzer layers of different sub-systems to render a diagnosis on a particular system or process based on the individual diagnoses of various machines from the respective IQ Expert and Analyzer layers. Thus a process line or a series of motors on a winder application, for example, can be diagnosed for a dancer problem (which may not be a problem with any one specific machine) because process problems may be manifested in the vibration or current data of a machine operating within the process.

Thus, the present invention affords for on-line diagnosis of a plurality of machines within the system by providing numerous analytical tools, the ability to automatically determine communications protocol being used, selecting from displaying different types of data sets (e.g., single data, trend data) and to be able to diagnose the health state of an entire process line.

The present invention also includes a machine diagnostics module which provides for an integrated device for collecting data from the machine in order for the present invention to determine the health thereof. More particularly, the diagnostic module includes a plurality of stacked circuit boards employed to perform various types of analyses (e.g., determine torque and speed, temperature, signal processing, determine RMS, calculate FFTs, perform positive and negative sequence analysis) of the machine. Accordingly, the aforementioned IQ Analyzing Layer is preferably resident thereon.

The diagnostic module may be coupled to a host computer within the system via a suitable data connection so that data relating to the aforementioned analyses can be transmitted to the host computer. Such data may include design details relating to the motor; vibration data; current data; motor ambient temperature data; voltage data; motor shaft rotation data; and other data relevant to diagnosing the health of the motor. The host computer can analyze this data in order to determine the health of the motor on-line.

The module of the present invention provides for autonomous data collection from a motor within the distributed network of the system. Since the module is specific to a single motor, sensors can be permanently mounted to the motor and connected to the module which improves data reliability. Furthermore, since the module is motor specific the data can be sampled continuously or at accelerated intervals as compared to once per month using conventional portable readers. Such accelerated sampling allows for more reliable trend analysis and forecasting.

Furthermore, the diagnostic module via the IQ Analyze layer preprocesses the collected machine data (e.g., calculates FFTs of vibration and/or current data) rather than supplying raw machine data to the host computer. As a result of receiving preprocessed data from the diagnostic module, the host computer can quickly render an analysis as to the health state of a machine. Such preprocessing of the machine data substantially facilitates trend and/or process analysis because the host computer must analyze multiple data sets. For example, as a result of such preprocessing the amount of data per machine that is processed by the host computer is relatively low thus affording for the host computer to diagnose a relatively large number of machines. Additionally, the low amount of data provides for efficient bandwidth utilization and also affords for employing a slower baud rate if desired. Moreover, because the data is preprocessed rather than the host computer performing all data processing greater speed in performing machine diagnosis is afforded.

By coupling a plurality of the modules to the host computer and employing the various software layers discussed above, on-line machine diagnosis can be performed on a plurality of machines as well as on-line diagnosis of a process employing some or all of the machines.

According to an embodiment of the present invention, a machine diagnostic system is provided which includes a host computer for determining a health state of a machine. The host computer is operatively coupled to a network backbone. The system also includes a machine diagnostic module adapted to be integrally mounted to a machine, the machine diagnostic module being operatively coupled to the network backbone. The machine diagnostic module collects data relating to operation of the machine and preprocesses the data, and the host computer analyzes the preprocessed data in determining the health state of the machine.

Another embodiment of the present invention provides for a system for on-line machine diagnosis which includes a host computer for determining a health state of at least one machine of a plurality of machines, the host computer being operatively coupled to a network backbone. The system also includes a machine diagnostic module adapted to be integrally mounted to the at least one machine, the machine diagnostic module being operatively coupled to the network backbone. The machine diagnostic module includes a set of stacked circuit boards, including: a power board planarly spaced apart including power supply and power sensor inputs; a signal conditioning board, operatively coupled to the power board, being planarly spaced apart and including a vibration sensor port; and a processor and memory board operatively coupled to the signal conditioning board and including a microprocessor and memory. The machine diagnostic module collects data relating to operation of the at least one machine and the machine diagnostic module preprocesses the data and the host computer determines a health state of the at least one machine via analyzing the preprocessed data.

Yet another embodiment of the present invention provides for a method for diagnosing the health state of a plurality of machines within a system which includes the step of using a diagnostic module to collect data from at least one of the plurality of machines. The method further includes the steps of using the diagnostic module to preprocess the collected data; storing the preprocessed data on a system memory; using a host computer to retrieve the preprocessed data; and using the host computer to analyze the preprocessed data to determine a health state of the at least one of the plurality of machines.

Still another embodiment of the present invention provides for a system for determining a health state of a motor, including a host computer for determining a health state of at least one motor of a plurality of motors, the host computer being operatively coupled to a network backbone. The system also includes a diagnostic module adapted to be integrally mounted to the at least one motor, the diagnostic module being operatively coupled to the network backbone, the diagnostic module collecting data relating to operation of the at least one machine and the diagnostic module preprocessing the data, the diagnostic module including a memory adapted to store design data relating to the motor, the diagnostic module storing the preprocessed data and motor design related data on a system memory. The host computer determines a health state of the motor by retrieving the preprocessed data and motor design data from the system memory and analyzing the preprocessed data and motor design related data.

Another embodiment of the present invention provides for a system architecture for employment in a system for diagnosing a health state of a motor. The system architecture includes: an analysis layer for collecting and preprocessing data related to the motor; a communications layer for transmitting the preprocessed data over a network; an expert layer to process the preprocessed data and determine a health state of the motor.

Yet another embodiment of the present invention provides for a system for determining a health state of a machine, including: means for collecting and preprocessing data related to the machine; means for communicating at least one of the collected and preprocessed data over a network; and means for receiving and processing the at least one of the collected and preprocessed data over a network and determining a health state of the machine.

Still another embodiment of the present invention provides for a system for displaying machine related information. The system includes a first computer operatively coupled to a machine, the first computer collecting raw data relating to the operation of the machine, the first computer preprocessing the raw data and storing the preprocessed data on a memory. The system also includes a second computer operative to receive the preprocessed data, the second computer being operatively coupled to a display. The second computer analyzes the preprocessed data and displays on the display at least one of a first visual indicia representative of a first operating condition of the machine and a second visual indicia representative of a second operating condition of the machine.

Another embodiment of the present invention provides for a machine diagnostic module adapted to be integrally mounted to the at least one machine, the machine diagnostic module being operatively coupled to a network backbone. The machine diagnostic module includes: means for collecting machine related data; means for preprocessing at least a portion of the machine related data; means for storing the machine related data and the preprocessed data; and means for determining the health of the at least one machine based on the machine related data and preprocessed data.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 3 is a representative display of the torque and speed at a motor in accordance with the present invention;

FIG. 4 is a representative display of the torque and speed for a plurality of motors in accordance with the present invention;

FIG. 7a is a representative display of RMS current for a motor in accordance with the present invention;

FIG. 8 is a representative display of the positive and negative sequence related to a motor in connection with the present invention;

FIG. 20b is a graph of a Fast Fourier Transform signal representative of the instantaneous motor current signal of FIG. 20a;

FIG. 21a is a graph of an instantaneous motor current signal for a motor having a bad bearing in accordance with one specific aspect of the present invention;

FIG. 21b is a graph of a Fast Fourier Transform signal representative of the instantaneous motor current signal of FIG. 21a;

FIG. 21c is a graph of a vibration signal for a motor having a bad bearing in accordance with one specific aspect of the present invention;

FIG. 21d is a graph of a Fast Fourier Transform signal representative of the vibration signal of FIG. 21c;

FIG. 22 is a table diagram of vibration amplitudes over a range of frequencies, which may be used to facilitate diagnosing the state of a dynamoelectric machine in accordance with the present invention;

DESCRIPTION OF THE PREFERRED EMBODIMENTS

Figure 1:
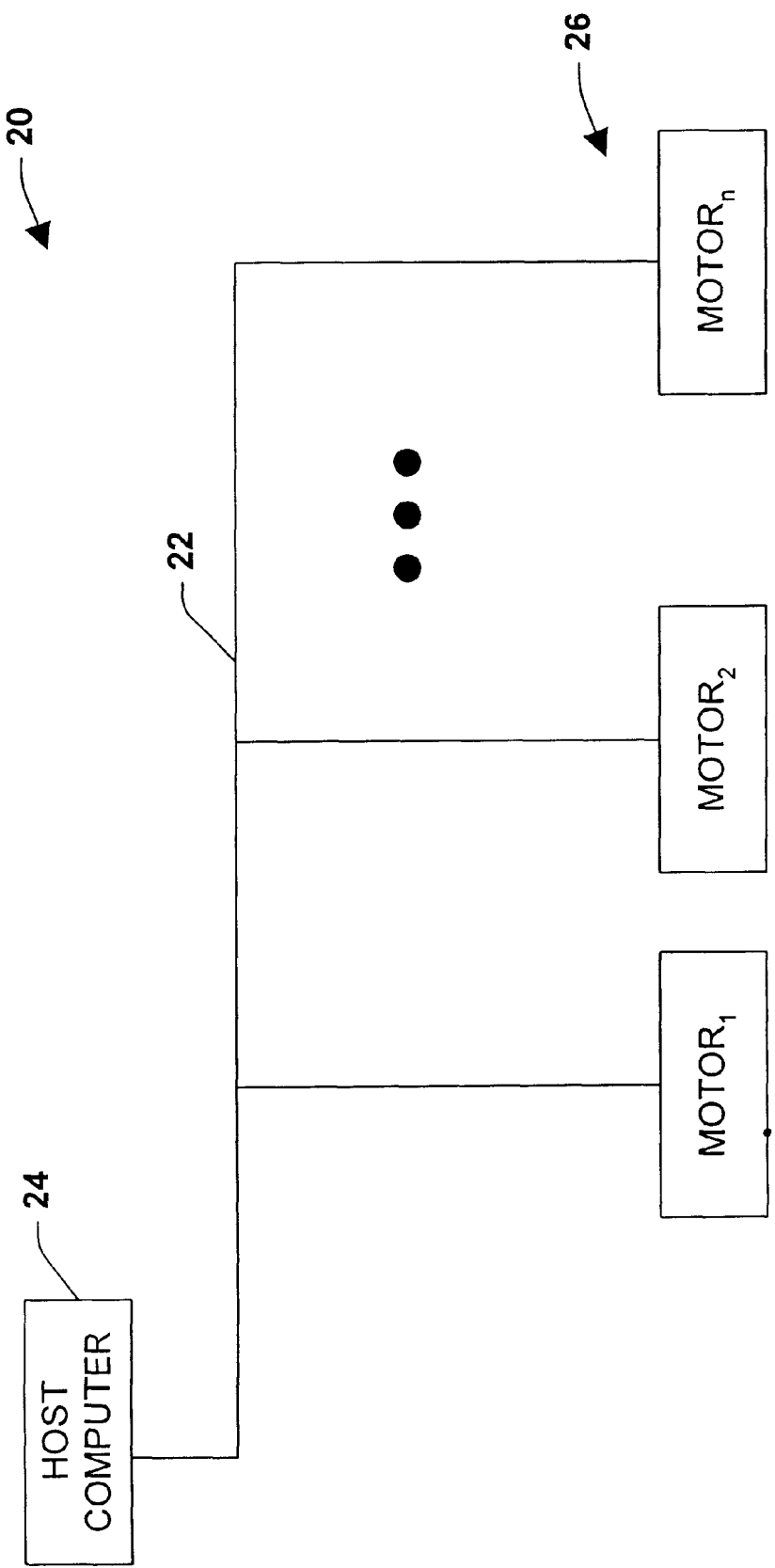
FIG. 1 is a block diagram representative of a distribute on-line machine diagnostic system in accordance with the present invention.

The present invention will now be described with reference to the drawings, wherein like reference numerals are used to refer to like elements throughout.

As is mentioned above, the present invention relates to a system architecture for obtaining and using machine data for on-line machinery diagnosis and failure prediction. Although the present invention is primarily discussed herein with respect to an AC induction motor, it is to be appreciated that the present invention can be applied to most electric machines and other rotating machines (e.g., motors, pumps, generators, gear boxes, etc.) and/or processes for determining the state (e.g., health) thereof.

Referring now to FIG. 1, a machine diagnosis system 20 is shown in accordance with an embodiment of the present invention. The machine diagnosis system 20 includes a network backbone 22. The network backbone 22 may be a hardwired data communication path made of twisted pair cable, shielded coaxial cable or fiber optic cable, for example, or may be wireless or partially wireless in nature. Coupled to the network backbone 22 is a host computer 24 and several machines 26. It is to be understood that "n" number of machines may be operatively connected to the network backbone 22. Although the machines 26 are shown hardwired to the network 22 it is appreciated that some machines may be wirelessly coupled to the backbone 22 via a base station (not shown) which serves as an entrance point through which wireless communications may occur with the network backbone 22. The wireless base station may be employed to expand the effective communication range of the system 20. For ease of understanding, reference numeral 26 will be used herein to refer to a single machine or a plurality of machines in accordance with the present invention.

As will be readily apparent from the discussion herein, the system 20 allows for on-line diagnosis of the machines 26. Data will be collected from each machine 26 and partially processed by a diagnostic module 28 (see FIG. 16) coupled to each machine 26, respectively, so as to produce diagnostic data. The diagnostic data is provided to the host computer 24 which analyzes the diagnostic data in order to render a health assessment of the machines 26 and/or a process employing the machines 26. The system 20 also provides for performing trend analysis on the machines 26. The system 20 further provides for displaying the diagnostic data and/or trends in a variety of formats so as to afford a user of the system 20 the ability to quickly interpret the health assessment and trend information provided by the system 20.

Figure 2:
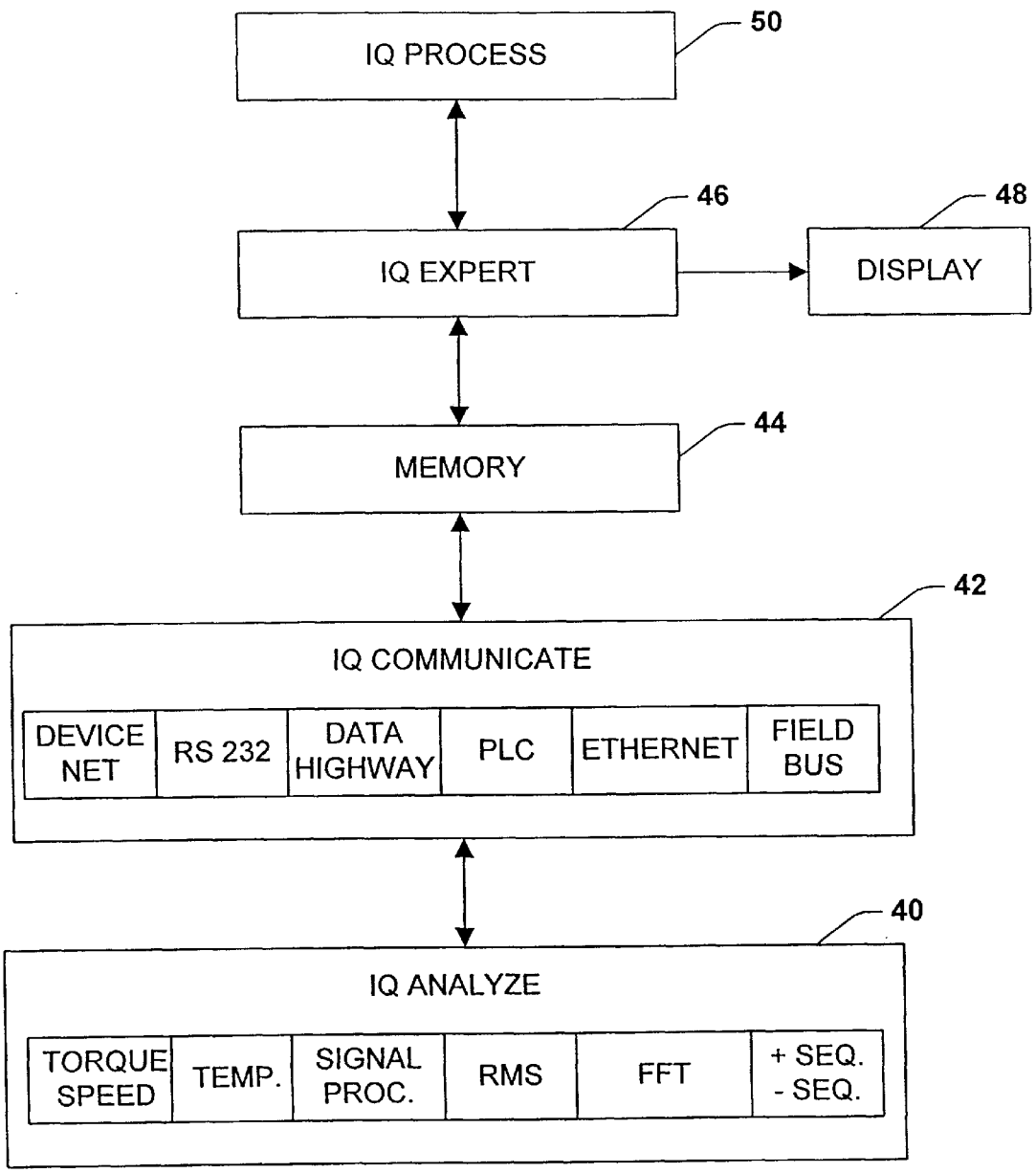
FIG. 2 is a functional block diagram of one specific embodiment of the system architecture of the present invention.

Referring now to FIG. 2 a flow diagram of various software layers and hardware (e.g., memory) layer(s) of the system architecture 20 is shown. At the ground level of the architecture is an IQ Analyze layer 40. The IQ Analyze layer 40 is preferably resident on the diagnostic module 28 (FIG. 16) because of proximity to the machine 26 of which data is being collected from. The IQ Analyze layer 40 executes algorithms relating to machine data collected by the diagnostic module 28. The IQ Analyze layer affords for selecting from a plurality of analysis tools to be employed on the collected motor data. For example, analysis may be based upon (1) torque and speed; (2) temperature; (3) signal processing; (4) RMS; (5) FFT; and (6) positive & negative sequence (e.g., sequence analysis is performed by taking the 3-phase power and decompressing it into positive and negative sequences in order to provide a goodness measurement of power). Thus, the IQ Analyze Layer 40 provides for applying one or a number of the above-identified analysis schemes to facilitate motor diagnosis. The aforementioned analytical tools are discussed in greater detail below in connection with the discussion of the diagnostic module 28.

The system architecture 20 also includes an IQ Communicate layer 42 which allows for interfacing with a plurality of types of machines 26 according to a desired communications protocol. For example, if the machine 26 is employing a DeviceNet protocol the IQ Communicate layer 42 allows for interfacing using a DeviceNet protocol. Other protocols which the IQ Communicate layer 42 is adaptable to handle include: RS 232; Data Highway; PLC; Ethernet; Field Bus, etc. The IQ Communicate Layer 42 may be predesigned for a given communications protocol, or alternatively the IQ Communicate Layer 42 may be designed to be smart so that a particular communications protocol being used can be identified and the IQ Communicate Layer 42 adapt to communicate using that protocol. The IQ Communicate Layer 42 writes diagnostic data obtained via the IQ Analyze layer 40 to a System Memory 44 (e.g., hard disk) located on the host computer 24.

Thus, in one embodiment of the present invention where the IQ Communicate layer 42 is pre-instructed as to which communications protocol is being employed by the machine 26 and the host computer 24, the IQ Communicate layer is preferably resident on the host computer 24. However, in another embodiment of the present invention where it is desired to have a more modular diagnostic module 28 which can be moved from one machine of a system to another machine of a different system (each system employing a different communications protocol) it is preferable to have the IQ Communicate layer resident at the diagnostic module 28.

An advantage of having the IQ Communicate layer 42 resident on the diagnostic module 28 is that it affords for a smart diagnostic module which can be coupled to a variety of systems using different communications protocols. For example, when the diagnostic module 28 is initially coupled to a machine 26 that is part of a system 20 in accordance with the present invention, the IQ Communicate layer 42 resident on the diagnostic module 28 may scan the network backbone 22 of the system and determine what type of communications protocol is being employed. It is to be appreciated that the network backbone 22 will have an interface suitable for the diagnostic module 28 to connect thereto. As an alternative embodiment, the diagnostic module 28 may include a plurality of network cards (e.g., PCMCIA cards), each card adapted to provide for communication in accordance with a particular communications protocol.

As noted above, the IQ Communicate layer 42 saves the motor diagnostic data on the system memory 44. An IQ Expert layer 46 is adapted to retrieve a set or sets of motor diagnostic data from the memory 44. The IQ Expert Layer 46 interprets and graphs the diagnostic data. A display 48 is operatively coupled to this layer 46 to display the data and interpretations thereof in a desired human readable manner (e.g., 3-dimensional graphics). The diagnostic data and/or analysis thereof which is displayed to a user facilitates the user's understanding of the health state of the machine 26. The IQ Expert layer 46 analyzes the diagnostic data in order to make a health determination of the particular motor 26 the diagnostic data is associated with. The diagnostic data is preprocessed by the IQ Analyze layer 40 as mentioned above. Such pre-processing of the collected motor data expedites rendition of a health assessment of the motor 26 by the IQ Expert Layer 46. In particular, the IQ Expert Layer 46 compiles the diagnostic data (which may also include manufacturer motor specifications) in its analysis thereof. The IQ Expert Layer 46 may also access historical motor data tables in order to determine the health state of the motor 26. For example, FIG. 22 illustrates a representative lookup table of motor data corresponding to a particular motor type. The IQ Expert Layer 46 may correlate the retrieved diagnostic data against the lookup table to make a determination that the motor includes a bad inner race, for example.

The IQ Expert Layer 46 also provides for analyzing multiple sets of data in order to perform trend analyses in connection with the health state of the machine. Since multiple data sets are analyzed during trend analysis. The preprocessing of the raw motor data by the diagnostic module 28 (FIG. 16) expedites trending performed by the host computer 24.

FIGS. 3 to 11 are representative displays that may be provided to a user for interpreting diagnostic data and the health state of the machine 26.

Figure 3:
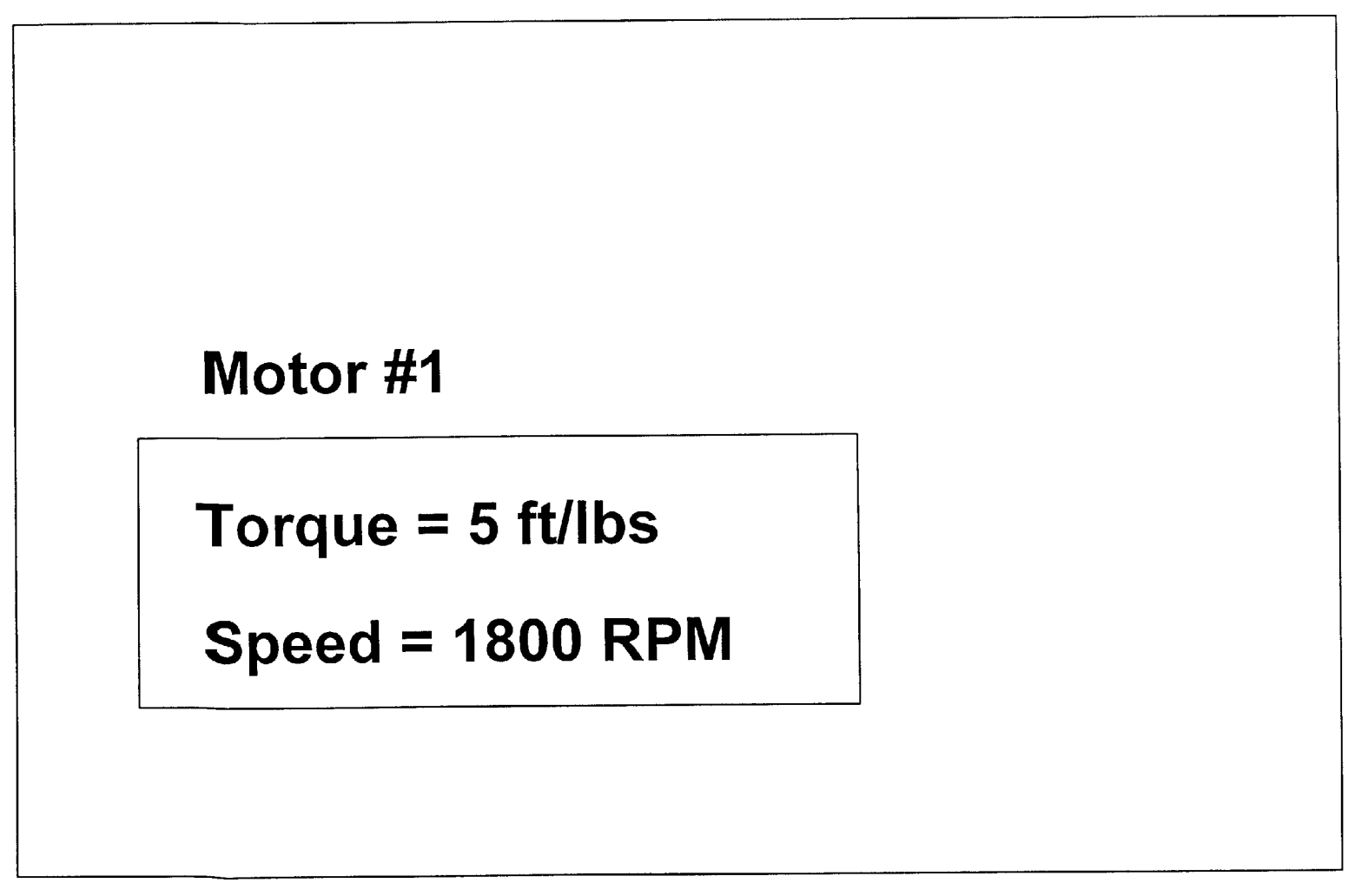

FIG. 3 is a display which identifies to a user the torque and speed of a particular motor. Since the system 20 is a distributed system which allows for simultaneous monitoring of a plurality of machines, the IQ Expert Layer 46 may display the torque and speed for a plurality of motors as shown in FIG. 4.

Figure 5:
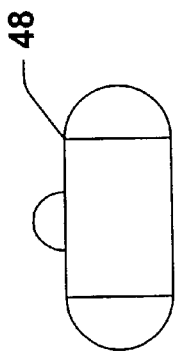
FIG. 5 is a representative display of temperatures relating to a motor in accordance with the present invention.

FIG. 5 is a display that may be produced by the IQ Expert layer 46 which provides for a user to quickly learn of the temperature of a particular motor or group of motors. The actual temperature of the motor 26 is shown, and underneath the actual temperature a normal operating temperature ($TEMP_{normal}$) is shown. A maximum operating temperature ($TEMP_{max}$) for the motor 26 may also be shown if desired. Additionally, a motor icon 48 is displayed on the screen. The motor icon will change in color in accordance with the temperature of the motor 26. For example, if the motor 26 is operating within a normal temperature range the color of the icon 48 will be green. If the motor 26 is operating with a questionable temperature range the color of the motor icon 48 will be yellow. If the motor 26 is operating at a dangerous or undesired temperature range the color of the motor icon 48 will be red. It will be appreciated that any colors suitable for conveying different temperature ranges of the motor may be used and are intended to fall within the scope of the present invention as recited in the hereto appended claims. Although, this aspect of the present invention has been described with respect to changing color it is to be appreciated that any suitable visual indicia (e.g., first visual indicia, second visual indicia and third visual indicia) for conveying operating conditions of the machine 26 may be employed and are intended to fall within the scope of the present invention as defined in the hereto appended claims.

Figure 6:
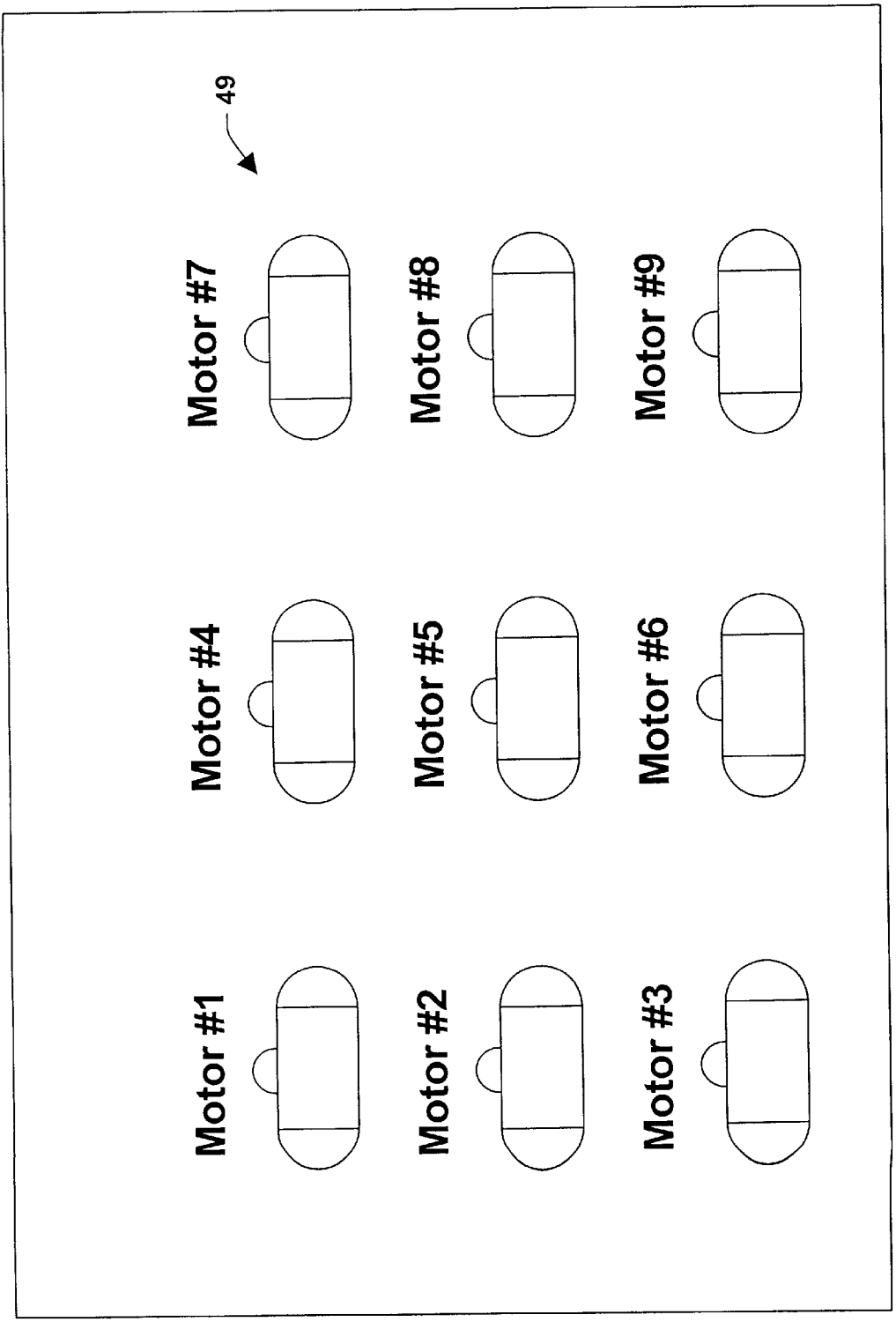
FIG. 6 is a representative display of a plurality of motor icons which visually convey motor related information in accordance with the present invention.

The IQ Expert Layer 46 may also display simply a plurality of motor icons 49 (each icon representing a particular motor within the system 20) as shown in FIG. 6 so that a user could quickly assess the temperatures of a plurality of motors quickly by simply visually scanning the colors of all of the icons 49. Such a display enables a user to very quickly determine a single overheated motor out of a large group of motors because the single overheated motor will have a yellow or red icon associated therewith and all of the other motors which are operating at normal temperature will have green icons associated therewith.

Figure 7B:
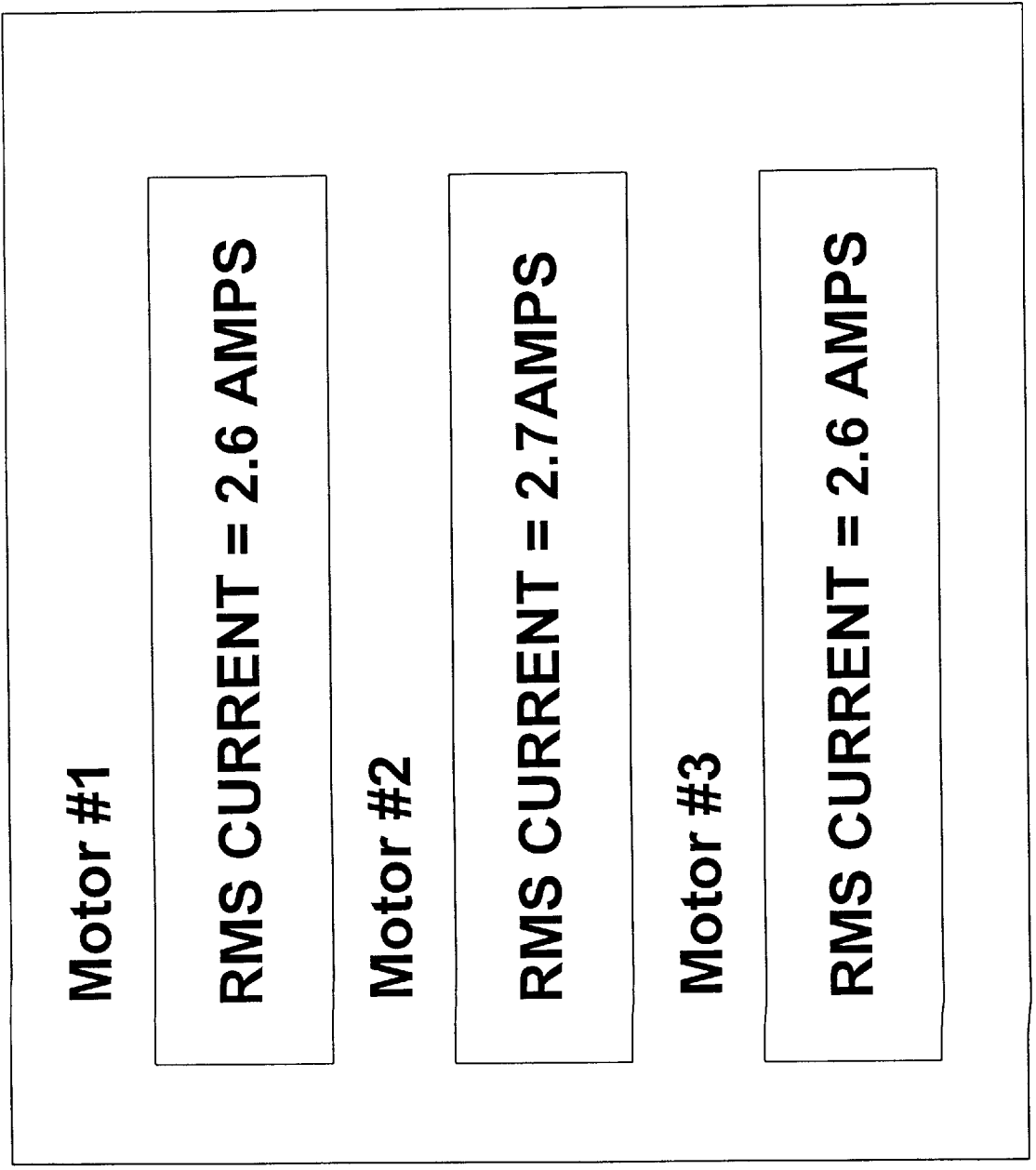
FIG. 7b is a representative display of RMS current for a plurality of motors in accordance with the present invention.

The IQ Expert Layer 46 may also provide a user with a display of the RMS current associated with a motor 26 as shown in FIG. 7a or the RMS current for a plurality of motors as shown in FIG. 7b.

As shown in FIG. 8, the IQ Expert Layer 46 may also provide a user with a display of the positive sequence and negative sequence analysis of the machine 26. Sequence analysis is performed by taking the 3-phase power and decompressing it into positive and negative sequences in order to provide a goodness measurement of power associated with the machine.

Figure 9:
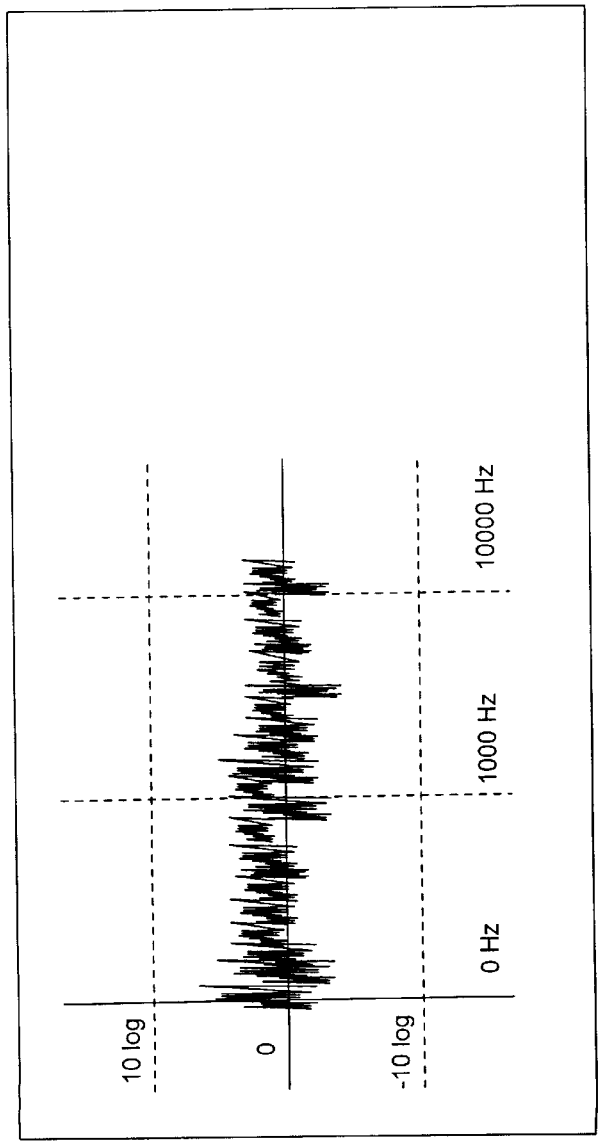
FIG. 9 is a representative display of an FFT for a vibration signal of a motor in accordance with the present invention.

The IQ Expert Layer 46 may further provide a display of an FFT of either or both vibration data and current data in connection with a particular motor as shown in FIG. 9 as well as multiple vibration data, voltage data and flux data.

Figure 10:
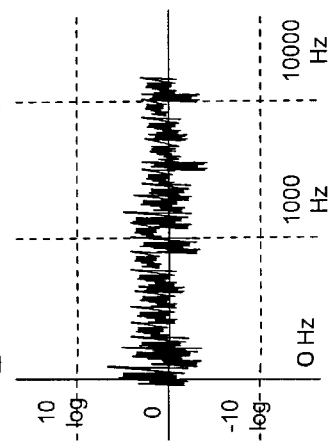
FIG. 10 is a representative display of a plurality of different pre-processed motor data in accordance with the present invention.

The IQ Expert Layer 46 may also provide a display of some or all of the following diagnostic data: (1) torque and speed; (2) RMS current; (3) positive and negative sequence analysis; (4) temperature; (5) vibration FFT; (6) RMS vibration and (7) current FFT for a particular motor 26 as shown in FIG. 10.

Figure 11:
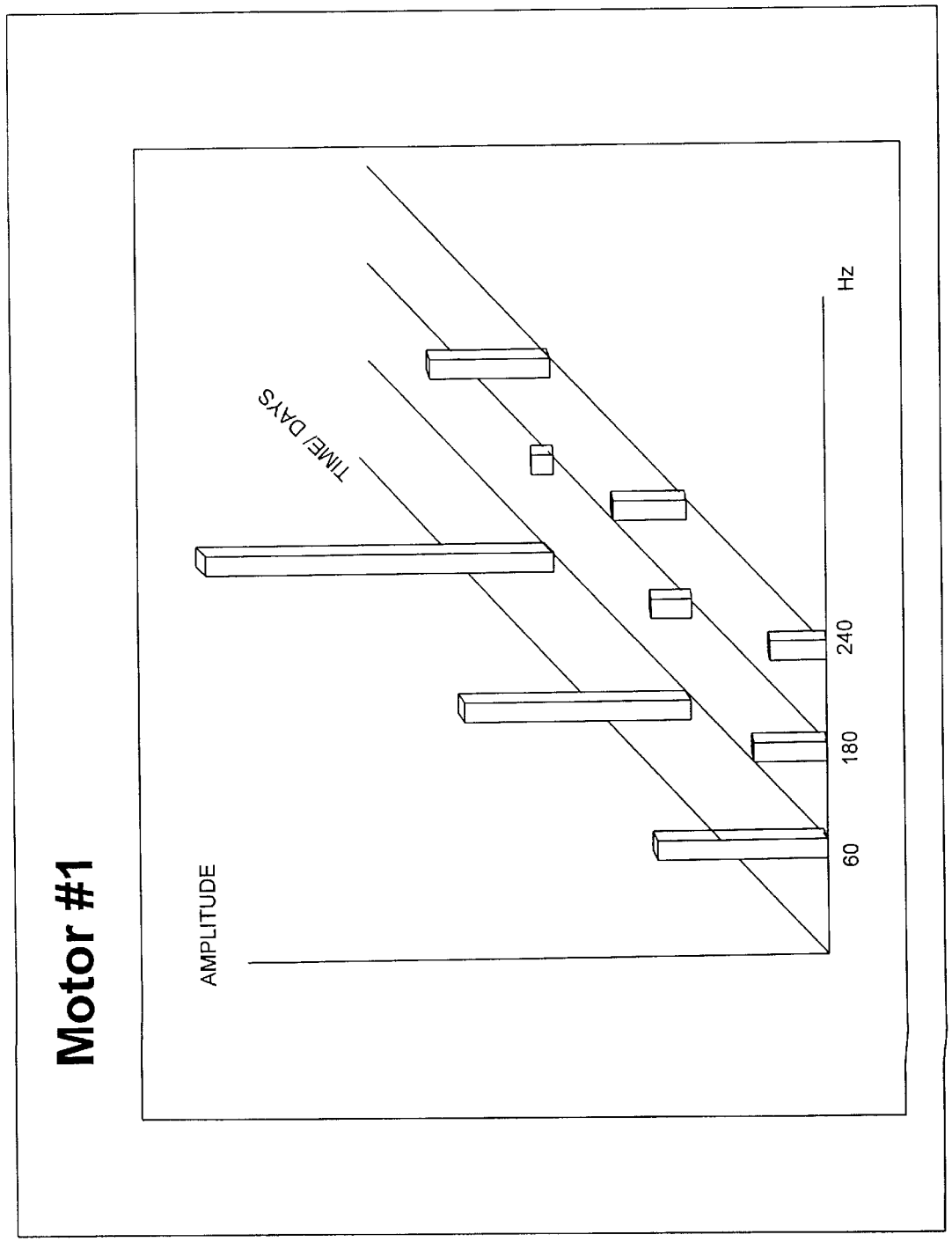
FIG. 11 is a representative display of motor trend data in accordance with the present invention.

Additionally, the IQ Expert Layer 46 may display trend information in connection with a motor 26 as shown in FIG. 11. The display of FIG. 11 is 3-dimensional with frequency identified along the x-axis; amplitude along the y-axis and time (e.g., in days, months or years) along the z-axis. As shown, the FFT vibration amplitudes for a motor 26 are shown at various frequencies (e.g., 60 Hz - line frequency; 180 Hz—$3^{rd}$ harmonic of line frequency; and 240 Hz—$4^{th}$ harmonic of line frequency) and this vibration data is trended over a three month period. It is to be appreciated that the IQ Expert Layer 46 can display the same data in 2-dimensional format as well, and display the data set at different frequencies and trend the data over different periods of time and different number of periods (e.g., 5 years at 6 month intervals).

Figure 12:
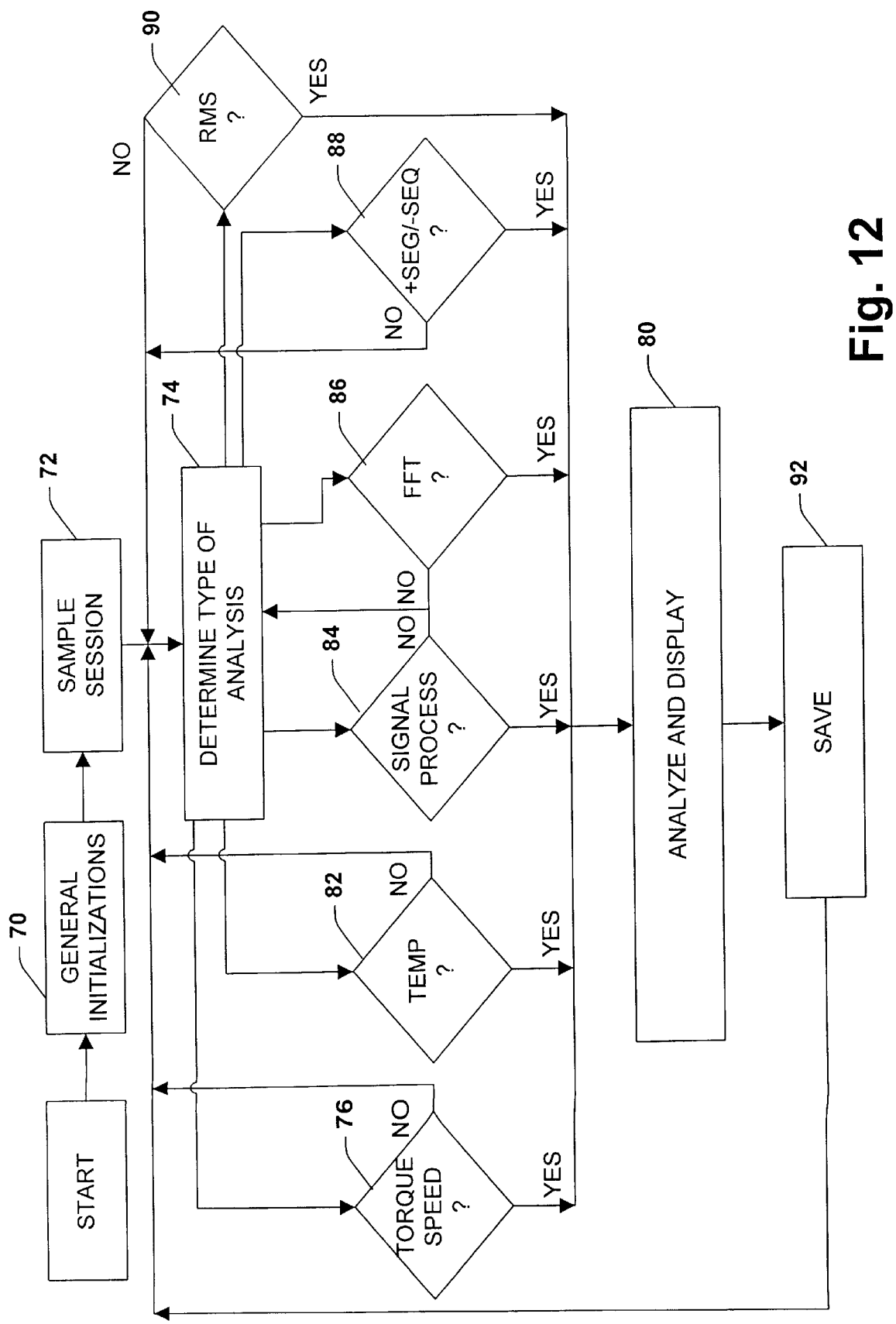
FIG. 12 is a flow diagram relating to the IQ Analyzing layer of the present invention.

Turning now to FIG. 12 a flow diagram in connection with the IQ Analyze layer 40 is shown. After the IQ Analyze layer 40 has been started as a result of a timer, user prompt, host computer prompt, etc., a processor 52 (see FIG. 17a) of the diagnostic module 28 performs general initializations in step 70. Thereafter, a sample session is initiated in step 72 by the processor 52 wherein motor data is collected by sensors 270 (FIG. 17a) of the diagnostic module 28. In step 74 the processor 52 determines the type or types of analyses to be performed on the collected data. In step 76, the processor 52 determines if a torque and speed analysis is to be performed. If yes, the processor 52 proceeds to step 80, and if no the processor 52 returns to step 74. In step 82, the processor 52 determines if a temperature analysis is to be performed. If yes, the processor 52 proceeds to step 80, and if no the processor 52 returns to step 74. In step 84, the processor 52 determines if a signal process analysis is to be performed. If yes, the processor 52 proceeds to step 80, and if no the processor 52 returns to step 74. In step 86, the processor 52 determines if an FFT analysis is to be performed. If yes, the processor 52 proceeds to step 80, and if no the processor 52 returns to step 74. In step 88, the processor 52 determines if a positive sequence and negative sequence analysis is to be performed. If yes, the processor 52 proceeds to step 80, and if no the processor returns to step 74. In step 90, the processor 52 determines if an RMS analysis is to be performed. If no, the processor 52 returns to step 74. If yes, the processor 52 proceeds to step 80.

In step 80, the processor 52 performs the desired analyses and transmits the data for display on a screen 254 (FIG. 17a) associated with the diagnostic module 28 pre-processed data in connection with any of the analyses that were performed on the raw collected data. The pre-processed data will be analyzed by the IQ Expert Layer 46, however, the pre-processed data may still be useful to a user located at the site of machine 26 and therefore is displayed in step 80. The processor 52 then proceeds to step 92 where the preprocessed data and/or raw data is saved to the memory 44 of the host computer 24 via the IQ Communicate layer 42. The data collection process and preliminary processing by the IQ Analyze Layer 40 is thus complete in relevant part and the processor 52 returns to step 74.

Figure 13:
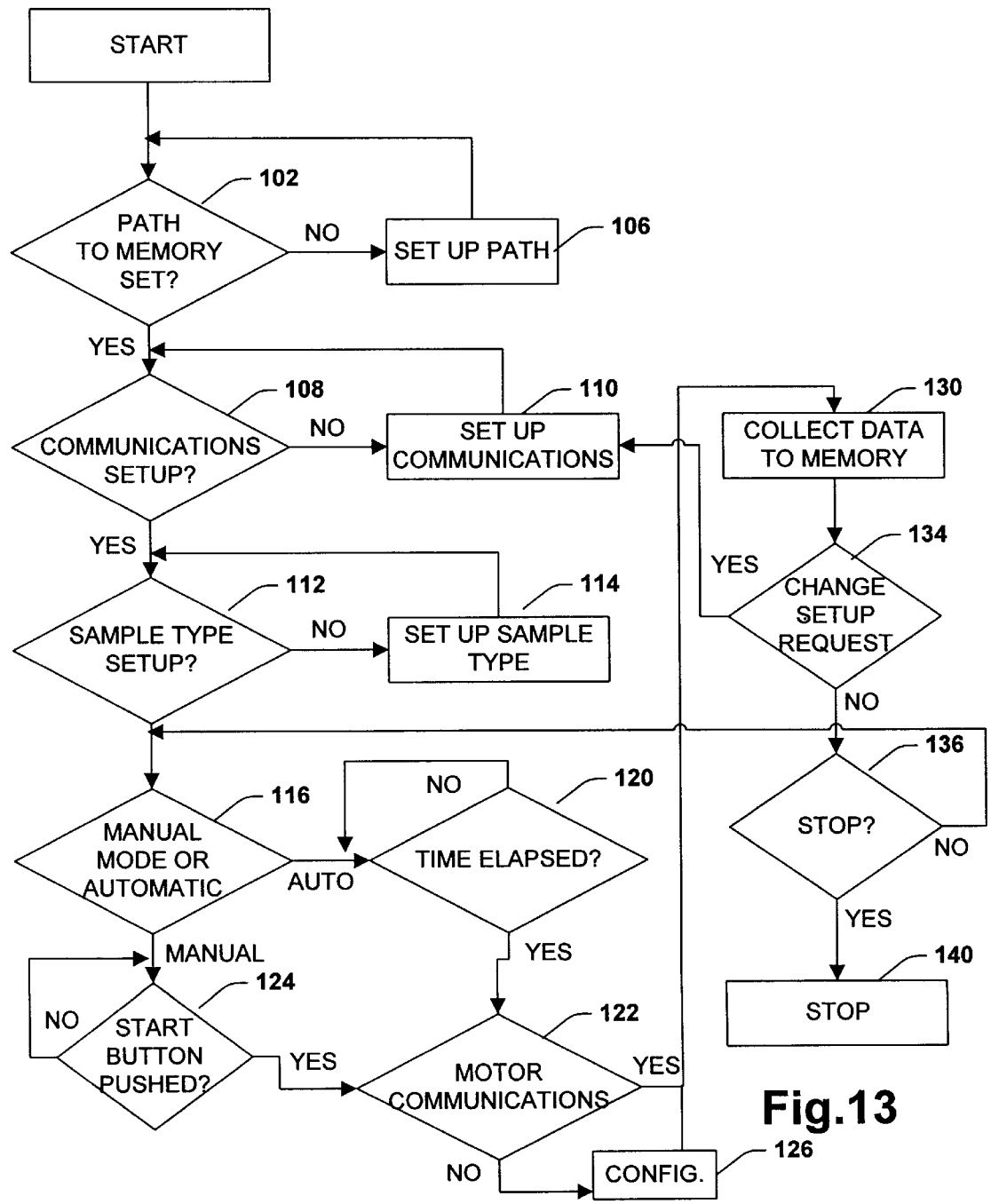
FIG. 13 is a flow diagram relating to the IQ Communicate layer of the present invention.

FIG. 13 is a flow diagram in connection with the IQ Communicate layer 42. This flow diagram illustrates operation of the IQ Communicate Layer 42 being resident on the host computer 24. The operation of the IQ Communicate layer 42 resident on the diagnostic module 28 will be substantially the same but will also include steps of determining the type of communications protocol being employed on the network backbone 22, and adapting the diagnostic module 28 to communicate with the host computer 24 by the particular communications protocol being employed, and the IQ Communicate Layer 42 will be driven by the processor 52 of the diagnostic module 28 rather than a processor 100 of the host computer 24.

Once the processor 100 of the host computer 24 has initiated the IQ Communicate layer 42, the processor 100 determines in step 102 whether or not a path to the memory 44 of the host computer has been set yet. If no, the processor 100 advances to step 106 where it sets up the path, and if yes the processor 100 proceeds to step 108 where it determines if communications are set up between the host computer 24 and the machine 26. If no, the processor 100 establishes communications between the two devices in step 110. If yes, the processor 100 moves to step 112 where it determines if the sample type has been setup. If no, the processor 100 in step 114 sets up the sample type. If yes, the processor 100 proceeds to step 116 where it determines if the data collection is to be carried out in manual mode or automatic mode.

If the processor 100 in step 116 determines that the data is to be collected in automatic mode, the processor 100 moves to step 120. In step 120 the processor 100 determines if a pre-determined amount of time has elapsed. If no, the processor 100 continues cycling through until the predetermined amount of time as elapsed. Once the predetermined amount of time has elapsed, the processor 100 advances to step 122 where it determines if all of the machine communications are functioning properly. The predetermined amount of time is suitably tailored so as to correspond to a desired data sampling rate.

Returning back to step 116 if the processor 100 determines that the data collection is triggered manually, it proceeds to step 124. In step 124 the processor 100 waits for a start button to be pushed. Once the start button has been pushed the process advances to step 122.

If the motor communications are functioning properly the processor 100 proceeds to step 130. If the processor 100 determines that the motor communications are not functioning properly the processor 100 proceeds to step 126 where the motor communications are established. Thereafter, the processor 100 proceeds to step 130 where the data is collected to memory. Next, the processor 100 determines if a change in communications setup is desired at step 134. If yes, the processor 100 returns to step 110, if no the processor 100 moves to step 1 36 where it determines if data collection should be stopped. If no, the processor returns to step 116, and if yes the processor 100 advances to step 140 where the data collection is stopped.

Figure 14:
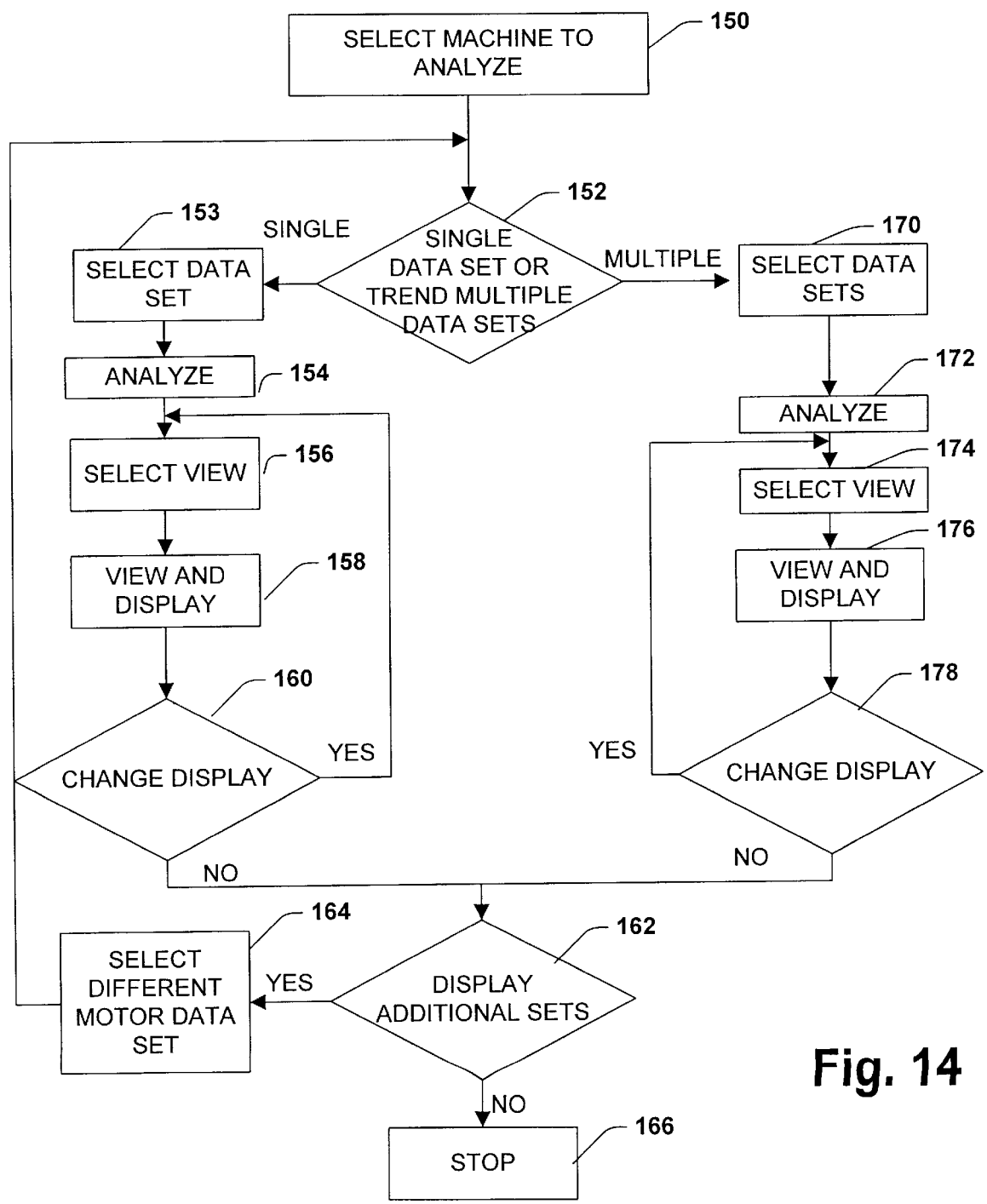
FIG. 14 is a flow diagram relating to the IQ Expert layer of the present invention.

FIG. 14 is a flow diagram of the IQ Expert Layer 46 which provides for assessing the health state of a machine 26 within the system 20. The processor 100 in step 150 initially selects a machine 26 to analyze. In step 152 the processor 100 determines whether a single data set or multiple data sets will need to be analyzed in order to make a health determination of the machine 26. If a single data set is only needed, the processor 100 advances to step 153 where it selects the data set. In step 154, the processor 100 analyzes the data set (e.g., via an expert system, neural network, threshold determination) in order to determine the health state of the machine 26. Thereafter, the processor 100 proceeds to steps 156 and 158 where it selects a view for a user to view the analyzed data set and displays the view. In step 160, the processor 100 determines if the user would like to change the display so as to view the data set in a different format (e.g., bar graph, 3-D, iconic). If yes, the processor 100 returns to step 156. If no, the processor 100 proceeds to step 162 where it determines if additional sets of data are to be analyzed and viewed.

Returning back to step 152, if the processor 100 determines that multiple data sets are to be analyzed for trending, for example, the processor 100 proceeds to step 170 where it selects the multiple data sets. In step 172, the processor 100 analyzes the multiple data sets in order to make a health assessment of the motor 26 based on the multiple data sets and/or trend the motor diagnostic data over a predetermined period of time. Thereafter, the processor 100 proceeds to steps 174 and 176 where it selects a view for a user to view the analyzed data set and displays the view. In step 178, the processor 100 determines if the user would like to change the display so as to view the data sets in a different format (e.g., bar graph, 3-D, iconic). If yes, the processor 100 returns to step 174. If no, the processor 100 proceeds to step 162 where it determines if additional sets of data are to be analyzed and viewed.

If in step 162 the processor 100 determines that additional data sets are to be analyzed, the processor 100 moves to step 164 where the different motor data set(s) are selected and then the processor 100 returns to step 152. If in step 162, the processor 100 determines that no additional data set(s) are to be viewed and/or analyzed the process stops at step 166.

Figure 15:
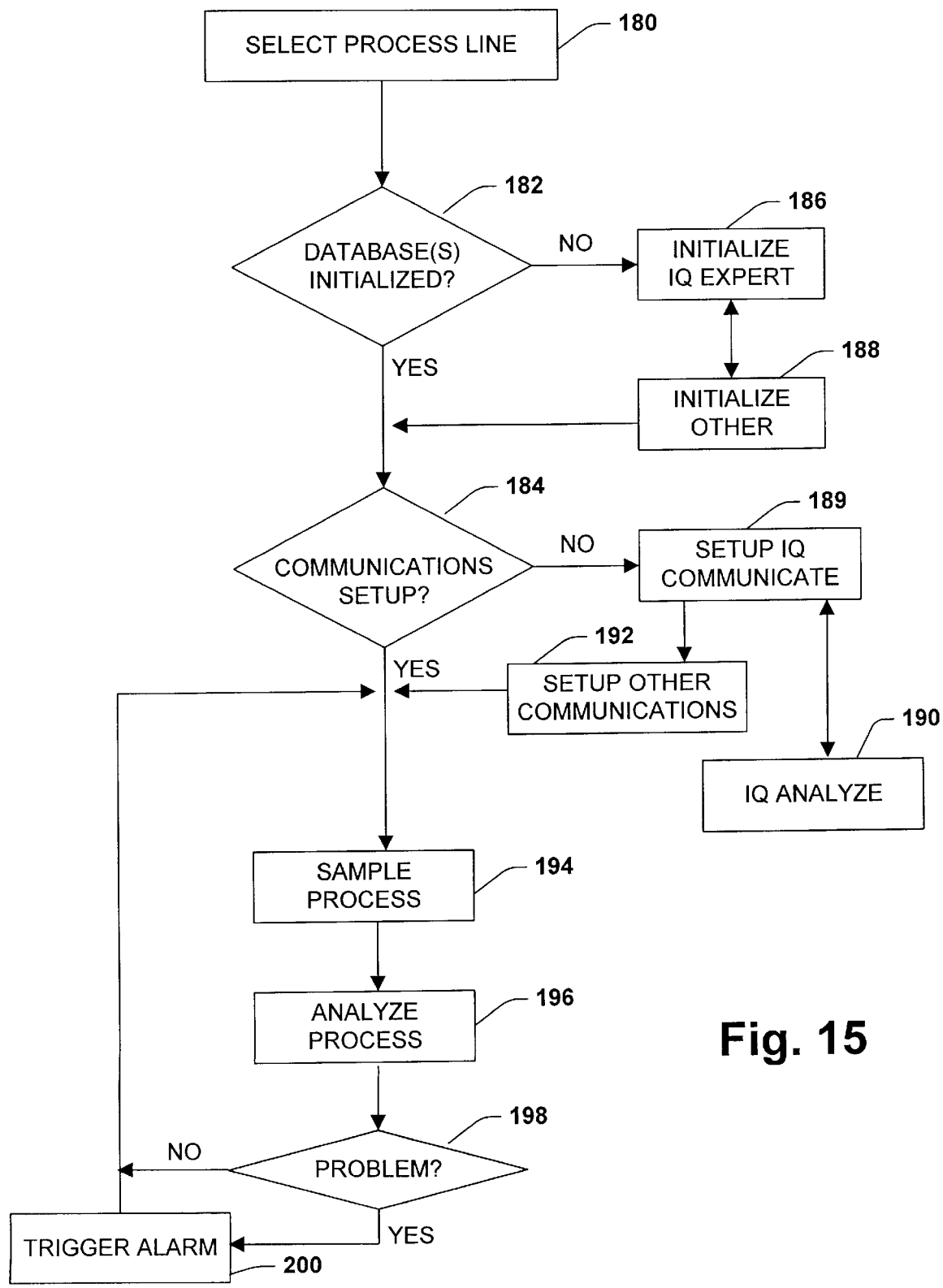
FIG. 15 is a flow diagram relating to the IQ Process layer of the present invention.

FIG. 15 is a flow diagram of the IQ Process layer 50 which provides for assessing the health state of a machine within the system 20. As mentioned above, problems associated with the process may manifest in the machines operating within the process. Thus, by analyzing diagnostic data of machines within the process, the IQ Process layer 50 may assess the health state of the process line employing the machines. In step 180, the processor 100 of the host computer 24 selects a process line for analysis. In step 182 the processor 100 determines whether or not the relevant databases are initialized. If yes, the processor 100 proceeds to step 184. If no, the processor 100 advances to step 186 where the IQ Expert Layer 50 is initialized and then to step 188 where any other layers that might need to be initialized are initialized. Then, the processor 100 proceeds to step 184.

In step 184, the processor 100 determines if communications between the host computer 24 and relevant machines 26 of the process are established. If no, the processor 100 proceeds to step 189 where the IQ Communicate layer 42 is setup. In step 190, the processor 100 sets up the IQ Analyze layer 40 and in step 192 setups any other communications that may be needed. The process then proceeds to step 194.

In step 194, machine data related to the process is obtained at a predetermined sample rate. Next, the processor 100 in step 196 analyzes the data and makes a health assessment of the process. In step 198, if the processor 100 determines that a problem exists within the process, the processor 100 advances to step 200 where an alarm is triggered and then returns to step 194. In step 198, if there is no problem with the process, the processor 100 returns to step 194.

Figure 16:
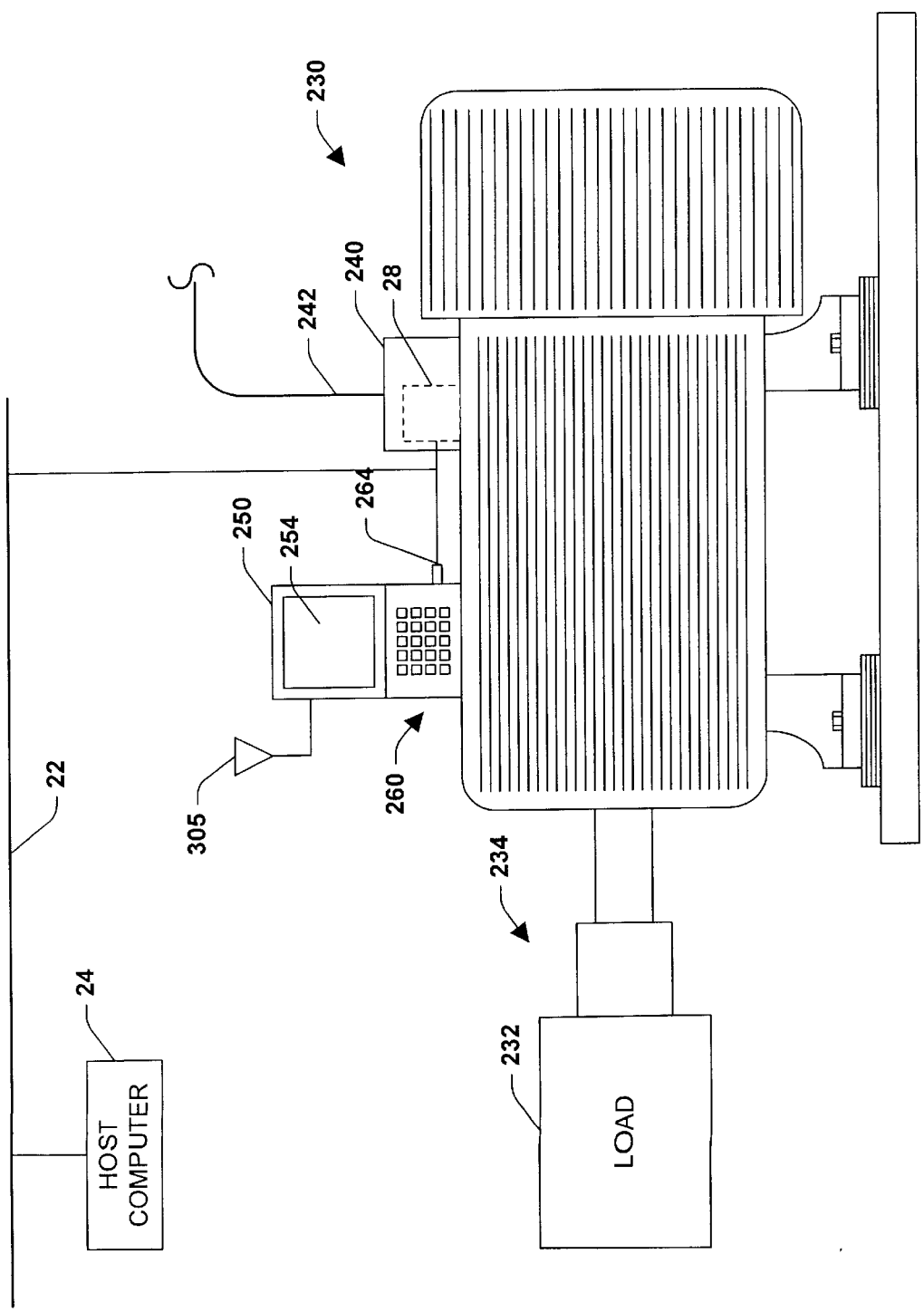
FIG. 16 is a side view of an integrated AC induction motor, interface device and diagnostic module in accordance with one specific aspect of the present invention.
Figure 17A:
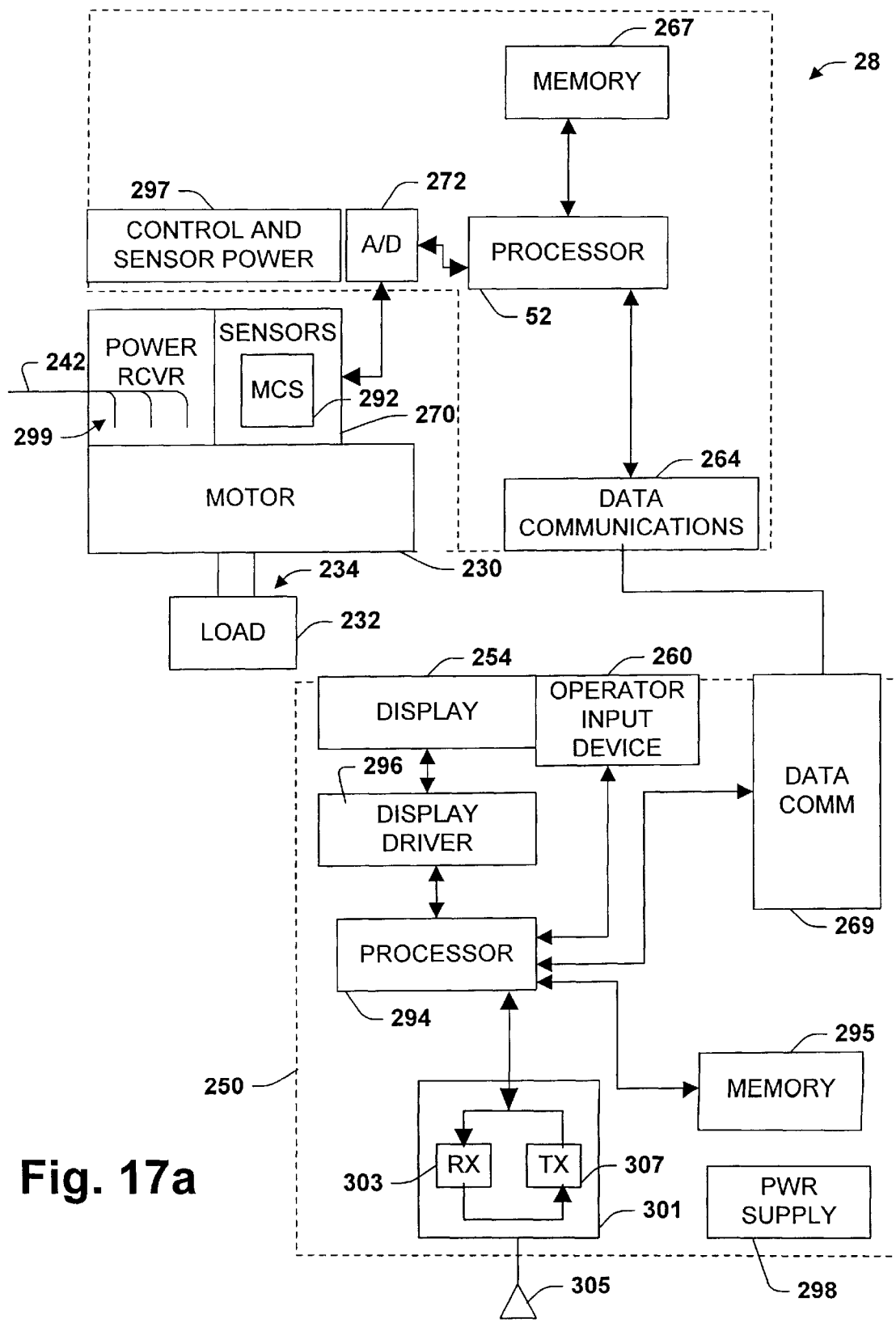
FIG. 17a is a functional schematic diagram of an integrated AC induction motor, interface device and diagnostic module in accordance with one specific aspect of the present invention.
Figure 17B:
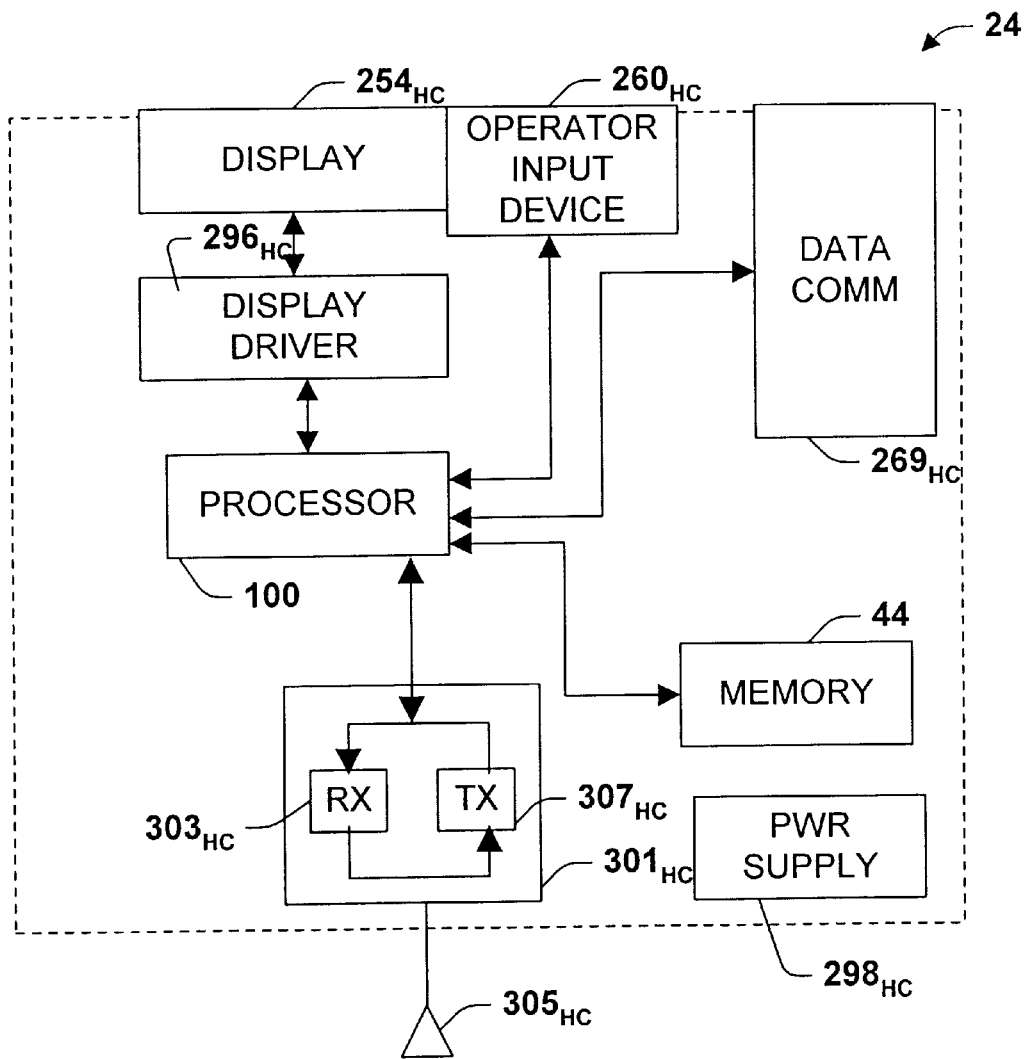
FIG. 17b is a schematic block diagram of the host computer in accordance with the present invention.

Referring now to FIGS. 16, 17*a* and 17*b*, one specific environment in which the present invention may be employed is shown. A three-phase AC induction motor 230 is depicted driving a load 232 through a shaft coupling 234. The motor 230 includes a junction box 240 for receiving conductors from power lines via a conduit 242, which are tied to power supply lines 299 of the motor 230. The motor 230 is AC powered and operates at an AC power line frequency of 60 Hz. However, it is appreciated that different line frequencies (e.g., 50 Hz) may be employed. Mounted inside the junction box 240 is the motor diagnostic module 28 (FIG. 17*a*) which as will be discussed in greater detail below provides for receiving and processing data relating to the health of the motor 230.

Coupled to the motor 230 and motor diagnostic module 28 is an interface device 250. The interface device 250 includes a display 254 for displaying to an operator information relating to the operation of the motor 230. The interface device 250 provides for viewing preprocessed motor data as discussed above via the IQ Analyze layer 40 and IQ Communicate layer 42. The interface device 250 further includes an operator input device 260 in the form of a key pad which enables a user to enter data, information, function commands, etc. as is conventional. For example, the user may input information relating to motor status via the keypad 260 for subsequent transmission to the host computer 24 via the IQ Communicate layer 42. In addition, the keypad 260 may include up and down cursor keys for controlling a cursor which may be shown on the display 254. The interface device 250 includes a communications port 269 for interfacing the interface device 250 with the motor diagnostic module 28 and the host computer 24 via a suitable communications link.

As mentioned above, the motor diagnostic module 28 is part of the communication system 20 including the network backbone 22. Information is transmitted via the network backbone 22 between the host computer 24, the interface device 250 and the diagnostic module 28. The communication link preferably adheres to the RS232C or DeviceNet standard for communicating command and parameter information. However, any communication link suitable for carrying out the present invention may be employed. It is to be appreciated that the interface device 250 may be integrated with the motor diagnostic module 24. See FIGS. 23*a*–23*b*.

Referring now in particular to FIG. 17*a*, a schematic representation of the present invention is shown according to one particular aspect of the present invention, wherein the motor diagnostic module 28 is integrated with the three phase induction motor 230 and the interface device 250. However, it will be appreciated from the discussion herein that the interface device 250 may be located remotely from the motor 230. Furthermore, it is to be appreciated that the diagnostic module 28 may serve to carry out substantially all of the functions described herein performed by the interface device 250 and/or the host computer 24.

The induction motor 230 includes the load 232 at the front end thereof. The output shaft 234 connects the load 232 to the motor 230. The load 232 may be any device or article typically driven by the motor 230 such as a pump, for example. The motor diagnostics module 28 is coupled to the motor 230 in a suitable manner. In the preferred embodiment, the diagnostic module 28 is mounted in the conduit box 240 which is attached to the motor housing. The enclosure (e.g., conduit box 240) used to house the diagnostic module 28 is suitably weatherproofed to protect the diagnostic module 28 from whatever environment (e.g., dust, moisture, heat, etc.) the motor 230 is working in. For example, the interior of the enclosure 244 may be suitably insulated with thermal insulation so as to protect the diagnostic module 244 from heat generated by the motor 230.

A plurality of sensors 270 are coupled to various parts of the motor 230. The sensors 270 may include, for example, temperature sensors (e.g., thermocouples), motor voltage sensors, vibration sensors (e.g., accelerometers), encoders, and current sensors (coupled to the 3-phase power lines 299), lube sensors, flux sensors, acoustic sensors, brush sensors, ultrasonic sensors, etc. for monitoring the operation of the motor 230. It is to be appreciated that any sensors suitable for carrying out the present invention may be employed and are intended to fall within the scope of the present invention.

The sensors 270 are tied to multi-channel analog-to-digital (A/D) converter 272 of the module, which converts the analog signals provided by the various sensors to digital form. The analog-to-digital converter 272 provides the processor 52 with digitally converted signals corresponding to the analog signals provided by the sensors 270.

The sensors 270 include at least one motor current sensor 292 and in the preferred embodiment three motor current sensors each of which are connected directly to different phase power lead wires 299 (shown as motor power) connecting the induction motor 230 to a source of power. Preferably, the motor current sensors 292 are Hall-effect sensors on each power line 299 which generate a signal corresponding to the current flowing through the respective power lead wire(s) 299. Alternatively, it will be appreciated that motor current may be monitored by a separate split core current transformer clipped on a phase line. Such devices may be clamped about a single lead wire to the motor 230 without requiring removal of insulation or breaking wire. Installation direction or location does not affect either precision or accuracy. It is to be appreciated that any sensor suitable for carrying out the present invention may be employed.

Figure 18:
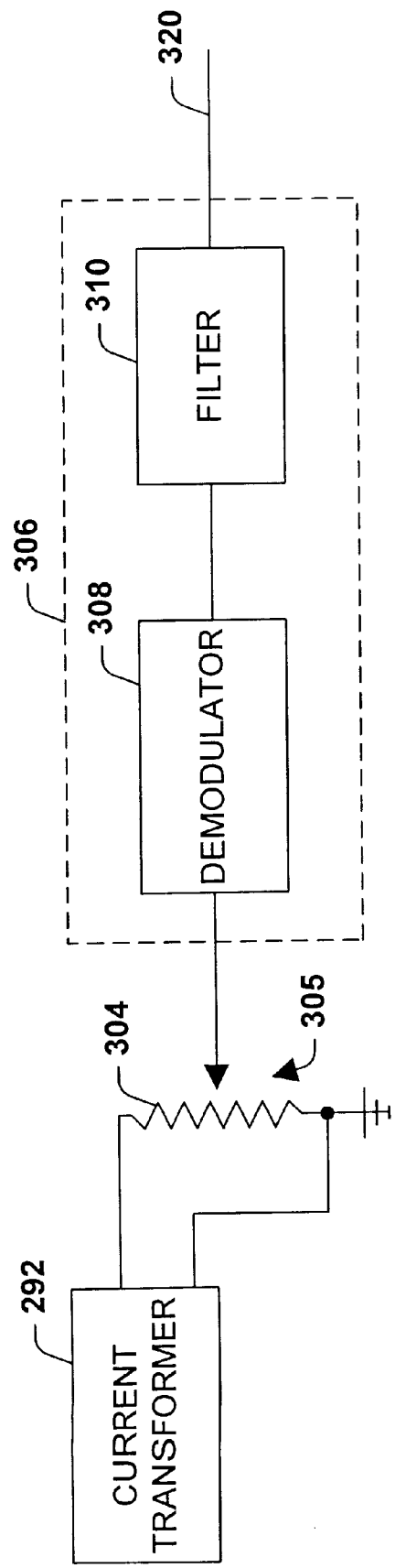
FIG. 18 is a block diagram of a current sensor and signal conditioning circuit in accordance with one specific aspect of the present invention.

Turning briefly to FIG. 18, the output of the motor current sensor (MCS) 292 according to one specific aspect of the invention is a variable current signal proportional to the time-varying current flowing in the lead wire 299, and is applied across a resistive system 304 to generate a varying voltage across the resistive system 304 which is proportional to the motor current. The resistive system 304 may be in the form of a potentiometer having one end grounded. The variable contact 305 of the resistive system 304 is connected to the input of a signal conditioning circuit 306. The resistive system 304 is adjusted to provide a selected proportional relationship between the motor current and the corresponding AC voltage signal applied to the signal conditioning circuit 306. The signal conditioning circuit 306 includes a demodulator 308, in this case an RMS-to-DC converter, a device which produces a voltage proportional to the root-mean square (RMS) value (over a preset time interval), of the motor current signal. The demodulated signal is fed through a low pass filter 310 having an upper frequency cutoff below 60 Hz to remove spectra associated with the 60 Hz line frequency and its harmonics. Preferably the demodulation and filtering is implemented via software, however, it is to be appreciated that hardware could be used as well—both techniques are intended to fall within the scope of the present invention.

As will be discussed in greater detail below and illustrated in FIG. 19, the conditioned signal 320 is then fed to the processor 52 in the herein described manner. The processor 52 extracts current signature information from the conditioned signal 320 obtained from the raw motor current. The current signature information is analyzed across a wide range of frequencies (e.g., fundamental, side band and harmonic ranges) to allow for the host computer 24 to determine the state of the motor 230. However, it should be appreciated that the analysis can be narrowly performed over select frequencies of interest such as critical ball pass frequencies, outer race frequencies, etc., for example.

Similarly, the vibration sensors are employed to collect vibration data relating to the motor. Vibration analysis is the established technique for determining the health of mechanical components in rotating machinery such as induction motors. The motor vibration data includes the sum of all the mechanical load changes which refer back to the motor. Accordingly, the motor vibration information is an indicator of a variety of mechanical and electrical modulations associated with the state of the motor 230. For example, various motor defect situations such as bearing wear, bent shaft, cracks in the various parts of the motor, etc. all manifest themselves through vibrations of the motor 230. To obtain vibration data for machinery analysis, accelerometers as well as associated sampling and filtering techniques are often employed. Larger machines and/or systems may employ proximity sensors to determine vibration.

In using accelerometers, the accelerometers are mounted on the machine being monitored. The location and orientation of the accelerometers is significant to the characteristics of the signal obtained. A vibration generated in one part of the machine is transmitted through the solids separating the source from the accelerometer. The analysis of the vibration signals taken at various times is dependent on the ability to reproduce the precise location and direction of mounting of the accelerometers. Thus, it is preferred that the accelerometers and/or their mounting fixtures be permanently installed on the motor to be monitored.

Since accelerometers sense vibration primarily in one direction (or one plane), multiple sensors are typically necessary to detect the vibrations generated in other directions and in different parts of some equipment. Thus, in order to sense all significant vibration directions, it may be necessary to install multiple-axis sensors. The results obtained are then combined and analyzed to develop the diagnostic information. To obtain good vibration data in order to perform the analysis it is desired to cover 5 axes with accelerometers (e.g., a 3-axis accelerometer at the load-end (x, y and z-axes) of the machine and a 2-axis accelerometer at the other end (orthogonal and radial axes)). One specific advantage of positioning the diagnostic module 28 (FIG. 16) on or proximate to the motor is that the length of wire from the sensor(s) to the diagnostic module 28 is minimized thus reducing the amount of ambient noise that may be introduced via the wires of the sensor(s). Preferably, the diagnostic module 28 is positioned on the motor 230 such that the length of a respective sensor wire is less than 3 feet.

Returning back to FIG. 17a, the processor 52 is responsible for controlling the general operation of the diagnostic module 28. The processor 52 is programmed to control and operate the various components within the diagnostics module 28 in order to carry out the various functions described herein. The processor or CPU 52 can be any of a plurality of suitable processors, such as the p24T, Pentium 50/75, Pentium 60/90, and Pentium 66/100, Pentium PRO and Pentium 2, Motorola MC68HC116Z1 CFC16 and other similar and compatible processors. The manner in which the processor 52 can be programmed to carry out the functions relating to the present invention will be readily apparent to those having ordinary skill in the art based on the description provided herein and thus further discussion related thereto is omitted for sake of brevity.

A memory 267 tied to the processor 52 is also included in the motor diagnostics module 28 and serves to store program code executed by the processor 52 for carrying out operating functions of the motor diagnostics module 28 as described herein. The memory 267 also serves as a storage medium for temporarily storing information such as vibration analysis data, current signature analysis data, motor temperature data, motor voltage data, shaft rotation data, vibration and current spectral tables (FIG. 22), and the like which will eventually be stored on the memory 44 of the host computer 24. The memory 267 may also include machine specific data which is used to facilitate machine diagnosis.

The memory 267 includes read only memory (ROM) and random access memory (RAM). The ROM contains among other code the Basic Input-Output System (BIOS) which controls the basic hardware operations of the motor diagnostics module 244. The RAM is the main memory into which the operating system and application programs are loaded.

Power is provided to the processor 52 and other components forming the diagnostic module 28 from a control and sensor power system 297. However, it will be appreciated that such power could be obtained from the motor power leads 299 themselves via power converting circuitry (not shown in FIG. 17a).

The diagnostics module 28 includes a data communication system 264 which includes a data communication port and communications card (See FIG. 32), which is employed to interface the processor 52 with the interface device 250 and/or the host computer 24 via the network 22 (FIG. 1). The communication link preferably adheres to the RS232C or DeviceNet standard for communicating command and parameter information. However, any communication link suitable for carrying out the present invention may be employed.

It should be appreciated that the present invention may be used in a system which does not include an interface device 250 and host computer 24. All processing including data analyses and motor state estimation and health determination could be accomplished by the processor 52 and the results transmitted to a PC or a control computer such as a programmable logic controller (PLC) (not shown). Furthermore, only one data link may be required. According to another embodiment, the processor 52 could be employed to simply trigger a single bit, digital output which may be used to open a relay and turn the motor 230 off.

The interface device 250 also includes a processor 294 responsible for controlling the general operation of the interface device 250. The processor 294 is programmed to control and operate the various components within the interface device 250 in order to carry out the various functions described herein. The processor or CPU 294 can be any of a plurality of processors, such as the p24T, Pentium 50/75, Pentium 60/90, and Pentium 66/100, Pentium PRO and Pentium 2, and other similar and compatible processors. The manner in which the processor 294 can be programmed to carry out the functions relating to the present invention will be readily apparent to those having ordinary skill in the art based on the description provided herein.

A memory 295 tied to the processor 294 is also included in the interface device 250 and serves to store program code executed by the processor 294 for carrying out operating functions of the interface device 250 as described herein. The memory 295 is adapted to store a complete set of the information to be displayed. According to a preferred embodiment, the memory 295 has sufficient capacity to store multiple sets of information, and the processor 294 could include a program for alternating or cycling between various sets of display information. This feature enables the display 254 to show a variety of effects conducive for quickly conveying motor state information to a user.

The memory 295 includes read only memory (ROM) and random access memory (RAM). The ROM contains among other code the Basic Input-Output System (BIOS) which controls the basic hardware operations of the interface device 250. The RAM is the main memory into which the operating system and application programs are loaded.

The display 254 is coupled to the processor 294 via a display driver circuit 296 as is conventional. The display 254 may be a liquid crystal display (LCD) or the like. In the preferred embodiment, the display 254 is a fine pitch liquid crystal display operated as a standard CGA display with a resolution of 640×480 pixels. The display 254 functions to display data or other information relating to ordinary operation of the motor 230. For example, the display 254 may display a set of discrete motor condition indicia such as, for example, fault indicia, caution indicia, and normal operation indicia which is displayed to the operator and may be transmitted over the network 22. Additionally, the display 254 may display a variety of functions indicating the operation of the motor 230. The display 254 is capable of displaying both alphanumeric and graphical characters.

Power is provided to the processor 294 and other components forming the interface device 250 from a power supply 298. However, it will be appreciated that such power could be obtained from the motor power leads 299 themselves via the diagnostic module 28.

The interface device 250 includes a communication subsystem 299 which includes a data communication port, which is employed to interface the processor 294 with the motor diagnostics module 28 and/or the host computer 24. The interface device 250 also includes an RF section 301 connected to the processor 294. The RF section 301 includes an RF receiver 303 which receives RF transmissions from the host computer 24 for example via an antenna 305 and demodulates the signal to obtain digital information modulated therein. The RF section 301 also includes an RF transmitter 307 for transmitting information to the network backbone 22 or host computer 24 for example in response to an operator input at input device 260 (FIG. 16).

FIG. 17b is a block diagram of the host computer 24 which includes similar components as the interface device 250. Like components between the host computer 24 and the interface device 250 include like reference numerals except that the reference numerals used to identify the host computer components will also include the subscript "HC". For sake of brevity those like parts are not discussed. It is to be appreciated that the processor 100 of the host computer 24 should be chosen to have sufficient processing capabilities to carry out the tasks described herein by the present invention.

The processor 100 processor is responsible for controlling the general operation of the host computer 24. The processor 100 is programmed to control and operate the various components within the host computer 24 in order to carry out the various functions described herein. The processor or CPU 100 can be any of a plurality of processors, such as the p24T, Pentium 50/75, Pentium 60/90, and Pentium 66/100, Pentium PRO and Pentium 2, and other similar and compatible processors. The manner in which the processor 100 can be programmed to carry out the functions relating to the present invention will be readily apparent to those having ordinary skill in the art based on the description provided herein.

The memory 44 is tied to the processor 100 and is also included in the host computer 100 and serves to store program code executed by the processor 100 for carrying out operating functions of the host computer 100 as described herein. The memory 44 includes read only memory (ROM) and random access memory (RAM). The ROM contains among other code the Basic Input-Output System (BIOS) which controls the basic hardware operations of the host computer 100. The RAM is the main memory into which the operating system and application programs are loaded.

Figure 19:
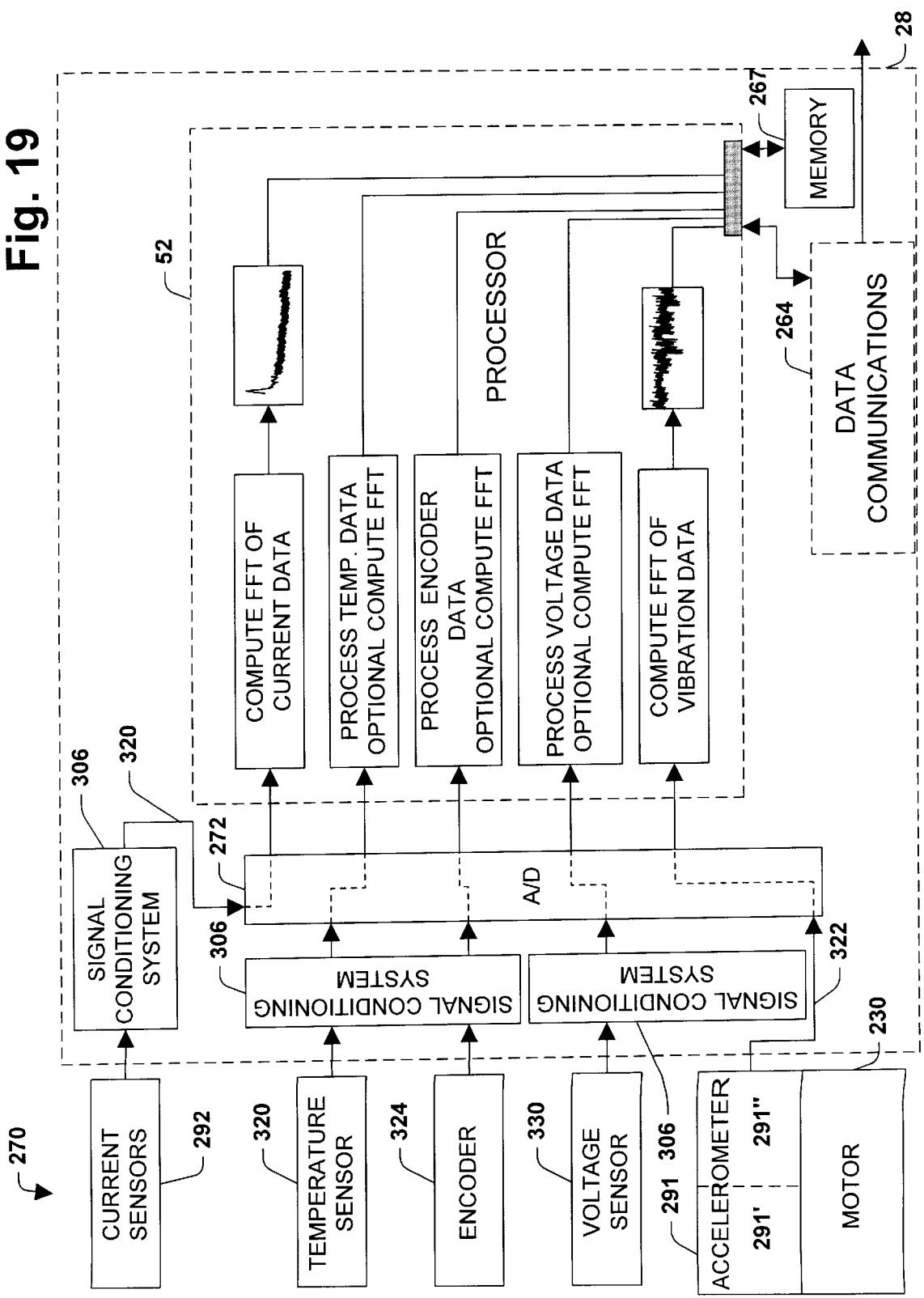
FIG. 19 is a functional block diagram illustrating collection of data relevant to motor health and processing of the data by a dynamoelectric machine diagnostic module in accordance with one specific aspect of the present invention.

Turning now to FIG. 19, a functional block diagram representing the collection of data relevant to the health of the motor 230 and the preprocessing thereof by the motor diagnostics module 28 is shown. Initially, various sensors are set up to collect motor data. The current sensor 292 is shown outside the motor diagnostics module 28, however, it will be appreciated that for smaller sized motors (e.g., less than 5 HP) the current sensors 292 may be located within the module 28. The current sensors 292 as discussed above collects data relating to motor current from the power leads 299 feeding the motor 230. The data from the current sensors 292 is conditioned by the signal conditioning system 306 and then converted into digital form by the analog to digital (A/D) converter 272. Thereafter, the digital current data is provided to the processor 52 which computes fast Fourier transforms (FFT) of the current data for use in current signature analysis.

Temperature sensors preferably in the form of thermocouples are positioned in suitable areas of the motor 230 to take temperature measurements thereof. For example, a temperature sensor may be positioned to take temperature readings of the front bearings of the motor 230. Another temperature sensor may be located in the stator windings of the motor, and yet another temperature sensor may be positioned to take temperature readings of the rear bearings of the motor.

The temperature sensors 320 are coupled to the A/D 272 via signal conditioning system 306, and the A/D converter 272 converts the analog temperature data to digital form. The digital temperature data is provided to the processor 52 for processing.

An encoder 324 is suitably positioned about the motor 230 to take readings relating to motor shaft rotation. Like the other data, the encoder data is conditioned and converted to digital form and then processed by the processor 52.

A voltage sensor 330 is suitably positioned to obtain motor voltage data. The voltage data passes through the signal conditioning system 306 and is also converted into digital form by the A/D converter 272 and then processed by the processor 52.

The motor 230 is also equipped with at least one vibration sensor 291 such as an accelerometer for taking sampled vibration data relating to the operation of the motor 230. In the preferred embodiment, a set of vibration sensors 291 is mechanically connected to the casing of the motor 230. A three-axis accelerometer 91' is located at the load bearing side of the motor 230, and a two-axis accelerometer 91" is located at the other side of the motor 230. However, the present invention may be carried out with one, single-axis accelerometer. Preferably, the vibration sensors 291 are laboratory-grade accelerometers such as those manufactured by PCB Piezoelectronics, Inc. Part No. 353B16 and providing 10 mv/g. However, it will be appreciated that any vibration sensor or proximity sensor suitable for carrying out the present invention may be employed. As mentioned above, the analog signals 322 from the vibration sensors 291 are converted to digital signals by the A/D converter 272 for processing by the processor 52. The accelerometer 291 performs its own signal conditioning and therefore its analog vibration signal 322 is input directly to the A/D 272.

The processor 52 controls the signal sampling and digitizing rate as well as any buffering of the digitized signals 320, 322 of the current data and vibration data, respectively, that might be needed. The data collection rate is carried out at for example 26,203 samples per second over a period of 8 seconds. This data collection rate provides sufficient data upon which the processor 52 can generate a comprehensive frequency spectrum of the motor current and motor vibration signals suitable for analysis using commercially available Fast Fourier Transform software such as for example MAT-LAB by The Math Works. The FFTs of the current signal data and the vibration signal data are discretized over N number of points for ease of processing. In the preferred embodiment, N=2,048, however, it will be appreciated that the FFTs of each signal may be discretized over any suitable number of points. Although, FIG. 19 illustrates FFTs being generated for only the vibration and current data for ease of understanding, it is to be understood and appreciated that FFTs may be generated for the other data signals (e.g., temperature, voltage and encoder) as well.

Figure 20B:
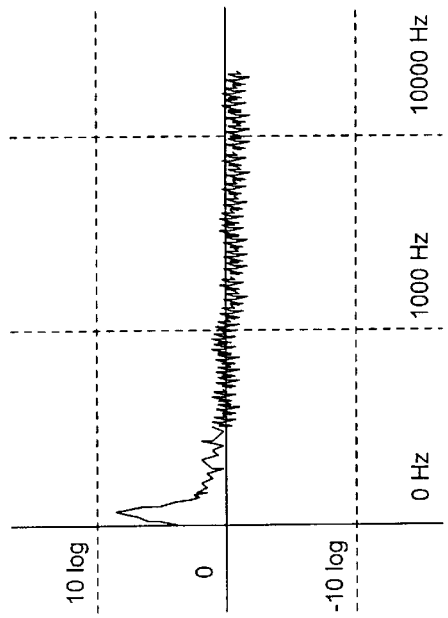
Figure 20D:
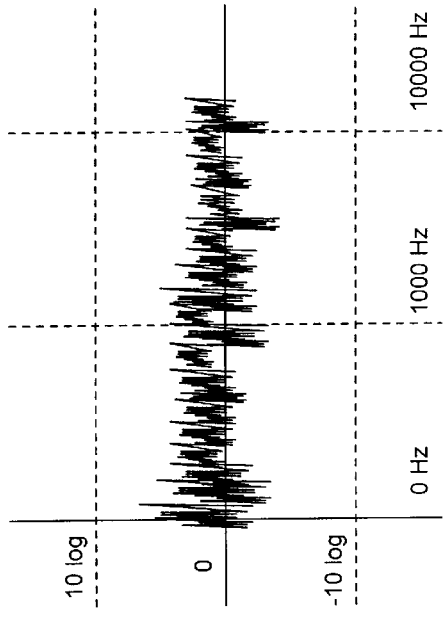
FIG. 20d is a graph of a Fast Fourier Transform signal representative of the vibration signal of FIG. 20c.
Figure 20A:
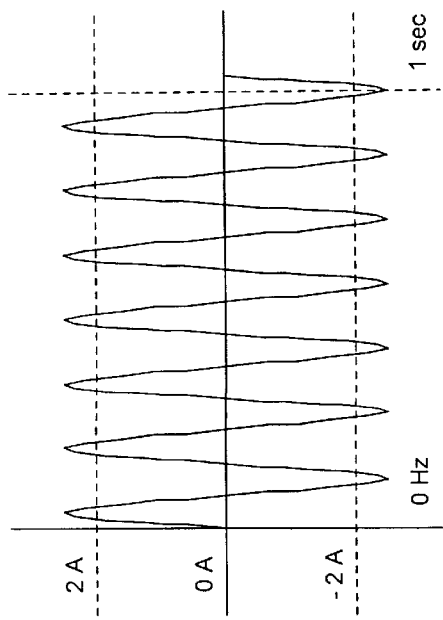
FIG. 20a is a graph of an instantaneous motor current signal for a motor having good bearings in accordance with one specific aspect of the present invention.
Figure 20C:
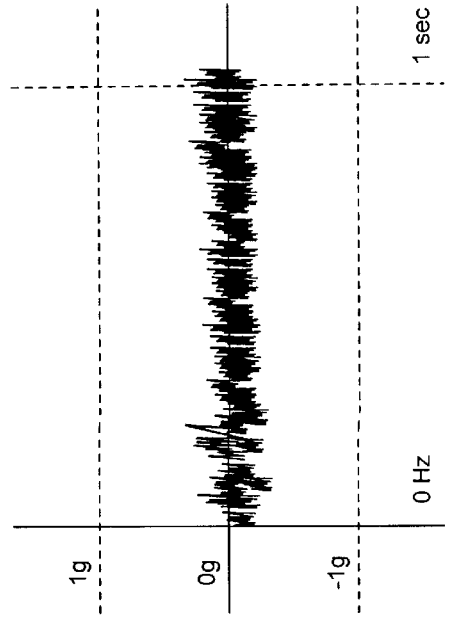
FIG. 20c is a graph of a vibration signal for a motor having good bearings in accordance with one specific aspect of the present invention.

Referring briefly to FIGS. 20a–20d and 21a–21d, representative graphs of motor current data, transformed motor current data, motor vibration data and transformed motor vibration data for the motor 230 with good bearings and the motor 230 with bad bearings are shown. In particular, FIG. 20a is a plot of raw, sampled time domain, current data of a motor 230 with good bearings. FIG. 20b is a corresponding frequency spectrum plot of the raw current data of FIG. 20a. FIG. 20c is a plot of the raw acceleration (i.e., vibration data) taken during the same time frame as the raw current data of FIG. 20a. FIG. 20d is a frequency spectrum plot corresponding to the raw acceleration data of FIG. 20c.

FIG. 21a is a plot of raw current data of the motor 230 with a bad bearing. In this example, bearing surfaces have been degraded by operating the motor with lubrication contaminated with silicon carbide (SiC) grit. FIG. 21b is a corresponding frequency spectrum plot of the raw current data of FIG. 21a. FIG. 21c is a plot of the raw acceleration (i.e., vibration data) taken during the same time frame as the raw current data of FIG. 21a. FIG. 21d is a frequency spectrum plot corresponding to the raw acceleration data of FIG. 21c.

Returning back to FIG. 19, once the processor 52 has processed all of the respective motor data, the processed data may be sent to the host computer 24 for analysis. The host computer 24 may then make determinations as to the health of the motor 230 based on the data received from the diagnostic module 24. Accordingly, motor maintenance can be scheduled to correspond with the state of the motor. Additionally, the processed data can be compiled for trend analysis and forecasting. Since the diagnostic module 24 is integrated with the motor, the data sampling rate can be substantially high thus providing for improved highly accurate and up to date data relating to the health of the motor 230.

However, as mentioned above, it is to be appreciated that motor diagnosis, trend analysis, forecasting, etc. that could be performed by the host computer 24 may also be performed directly by the diagnostic module 28.

Turning now to FIG. 22 a table 400 is shown which the processor 52 or processor 100 of the host computer 24 may access when performing vibration analysis to diagnose the health of the motor 230. The table 400 includes vibration amplitude data ($A_O$ thru $A_Z$) over a range of frequencies ($f_O$ thru $f_N$). The table 400 is stored in the memory 267 of the motor diagnostic module 28 so as to be easily accessible by the processor 52 or alternatively stored in the memory 44 of the host computer 24 so as to be easily accessible to the processor 100. The table 400 includes various health states of the motor shown generally at 402 which correspond to vibration amplitudes over the frequency range $f_O$ thru $f_N$. For example, referring to the row identified by reference numeral 404, when the vibration amplitudes are sufficiently close to $A_{234}$ at $f_O$, $A_{27}$ at $f_1$, $A_{478}$ at $f_2$, $A_{24}$ at $f_3$, $A_{127}$ at $f_4$, . . . , $A_Q$ at $f_N$, the table 400 indicates that the motor 230 has a bad bearing. As will be appreciated, the table 400 can store an enormous amount of vibration signatures corresponding to various health states of the motor 230, which one of the processors 52 or 100 can employ to diagnose the health of the motor 230.

The processors may utilize various analytical techniques such as those which generally fall under the category of classical vibration analysis which have been proven to detect certain mechanical problems such as, for example, bearing failure, rotor problems, contamination from water or grit, holes in bearings, flat areas on bearings, broken or loose motor mounting, misalignment of motor shaft and load shaft, bent shafts, loose couplings, stator winding problems, fan problems, etc.

Similarly, other tables may be stored in the memory so that the processor can determine the state of the motor 230 with respect to the current signature data, motor temperature data, motor voltage data, motor shaft rotation data, etc.

Although the present invention has been described with respect to obtaining Fast Fourier Transforms of the current signals and vibration signals, it should be appreciated that other suitable techniques may be employed. For example, wavelet transforms may be taken of the various sensor data in connection with pattern classification via joint time frequency analysis. Since an original signal C<n> can be recovered from, for example, a polynomial sequence having coefficients C<0>, D<0>, D<1>, . . . , D<n–1>, this sequence can be thought of as a transform of the original signal, and is known as a wavelet transform. One advantage to using the wavelet transform is that the total size of the transform C<0>, D<0>, . . . , D<n–1> is a compact representation of the original signal and will require considerably less storage than the original signal.

Wavelet transforms have a number of properties that make them attractive for signal processing. For example, if filters are constructed to be sparse, then a filter bank operation can be performed very quickly. Also, for many of the signals encountered in practice, a large percentage of the entries in the wavelet transform are negligible. Wavelet compression methods can therefore approximate the original set of samples in C<n> by storing only the significant coefficients of the wavelet transform.

Wavelets have a variety of applications, for example, wavelets have been used in signal analysis, as discussed in Mallat, "A Theory for Multiresolution Signal Decomposition: The Wavelet Representation," IEEE transactions on Pattern Analysis and Machine Intelligence 11(7):674–693, July 1989. Wavelets have also been used in image processing and numerical analysis, as discussed in DeVore, Jawerth, and Lucier, "Image Compression Through Wavelet Transform Coding," IEEE Transactions on Information Theory 38(2):719–746, March 1992 and Beylkin, Coifman and Rokhlin, "Fast Wavelet Transforms and Numerical Algorithm I," Communications on Pure and Applied Mathematics 44:141–183, 1991, respectively. All of these references are hereby incorporated by reference in their entirety.

All that is required for performing a wavelet transform is an appropriate set of analysis and synthesis filters. By using the wavelet transform, a much smaller, compact, training set can be employed, which still enables the present invention to reconstruct the original signal information. One particular example of using the compact representation property of wavelets is to generate the wavelet transforms of raw sampled current and raw sampled vibration. Since wavelet coefficients are a compact representation of the original signal, these coefficients can be used directly to perform machinery diagnosis using joint time-frequency domain methods.

This approach also affords for a pseudo frequency domain and time domain analysis of the signal data. Wavelet coefficients thus may provide robust estimates of fractal dimension even in the presence of significant noise. Such an aspect of the present invention involves relative simplicity of implementation while affording great flexibility in accommodating a broad range of signal types and noise levels.

It is also to be appreciated that the present invention may optionally employ chaos theory. Chaos theory may be a useful tool to facilitate determining system defects and/or rotating machinery problems at early stages.

Figure 23A:
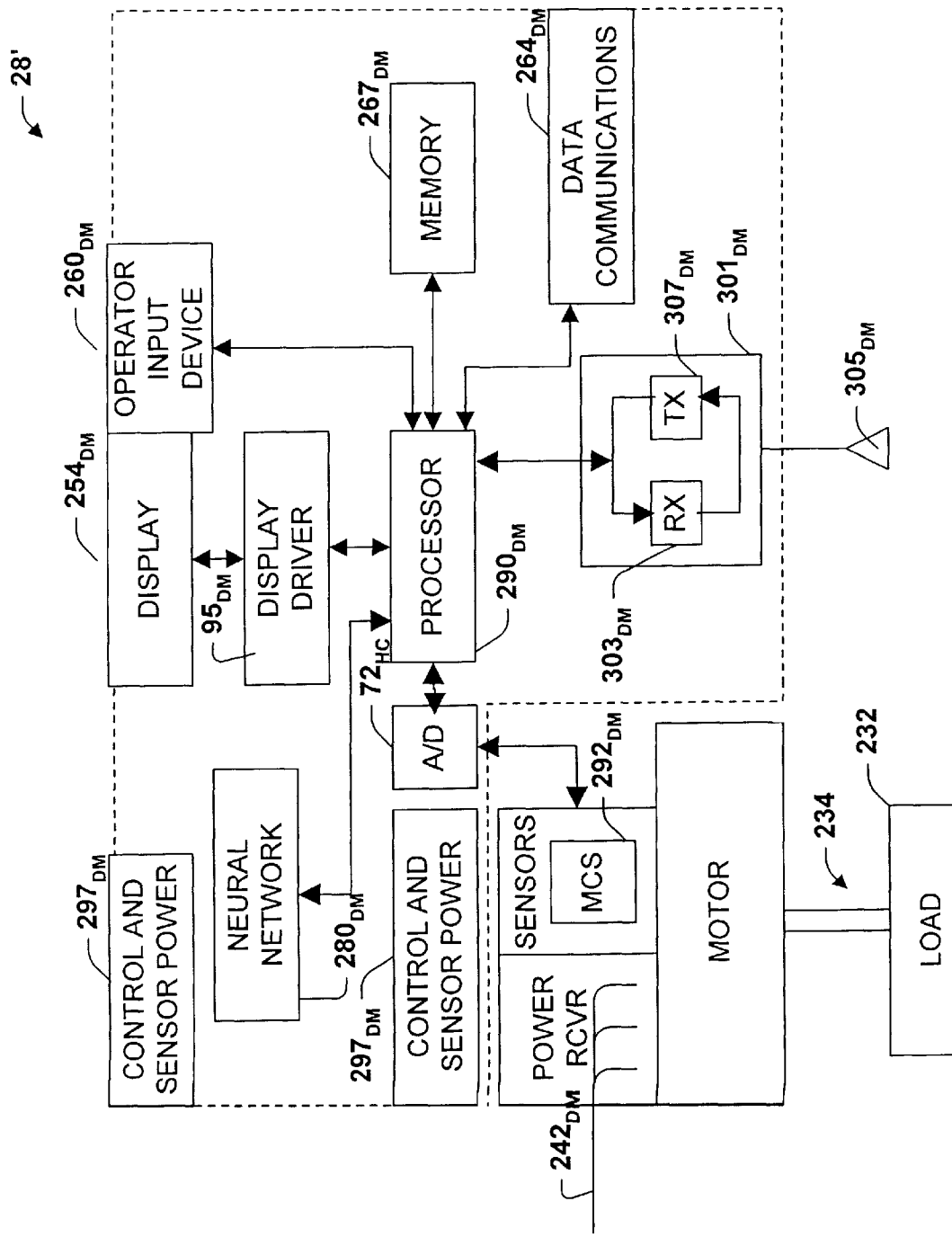
FIG. 23a is a functional schematic diagram of a diagnostic module including an operator interface device and employing a neural network in accordance with one specific aspect of the present invention.
Figure 23B:
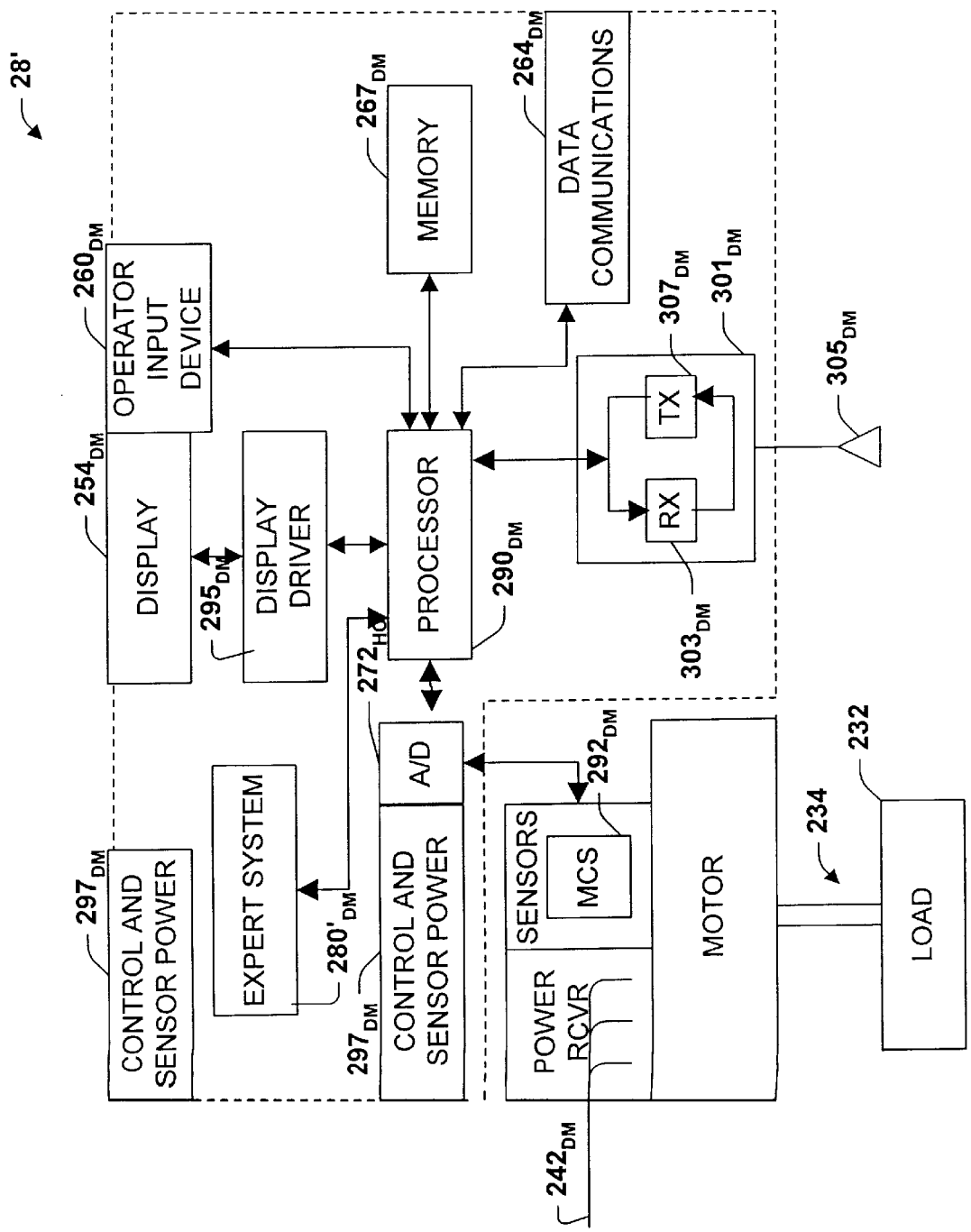
FIG. 23b is a functional schematic diagram of a diagnostic module including an operator interface device and employing an expert system in accordance with one specific aspect of the present invention.

Turning now to FIG. 23a, another specific aspect of the present invention is shown wherein the diagnostic module 28' functions to carry out the operations of the interface device 250 as well. The diagnostic module 28' includes essentially the same components as the diagnostic module 28 except that it also includes interface device 250 components as well. Accordingly, like parts between the diagnostic module 28 (FIG. 17a) and the interface device 250 (FIG. 17a) will share like reference numerals. However, the reference numerals of FIG. 23a for the diagnostic module 28' further include the subscript (DM) to designate that the component is associated with this particular embodiment. Further discussion as to the functioning of the components is not repeated for sake of brevity and to avoid redundancy. However, in this embodiment, the diagnostic module 28' further includes a neural network which is employed to facilitate data analysis and processing. The use of neural networks for motor diagnostics is well known in the art and thus further discussion relating thereto is omitted for sake of brevity. It will be appreciated that the present invention may optionally employ an expert system 280' in lieu of or in addition to the neural network as shown in FIG. 23b. The expert system 280' provides for classification based on inference to derive more knowledge about a subject and in turn employ logical reasoning in making a decision.

Expert systems are typically knowledge-based rule-driven systems. The expert system 280' is employed in accordance with the present invention by establishing a hardware or software based program which receives input from a knowledge expert as to the nature of the items being sought for classification—in this case motor state. That is, during the training, an expert generates a rule or set of rules for each decision and stores given data into the knowledge base. The expert system 280' will then employ an "inference" engine to establish the health of the system or machine based upon codified expert level knowledge.

Figure 24:
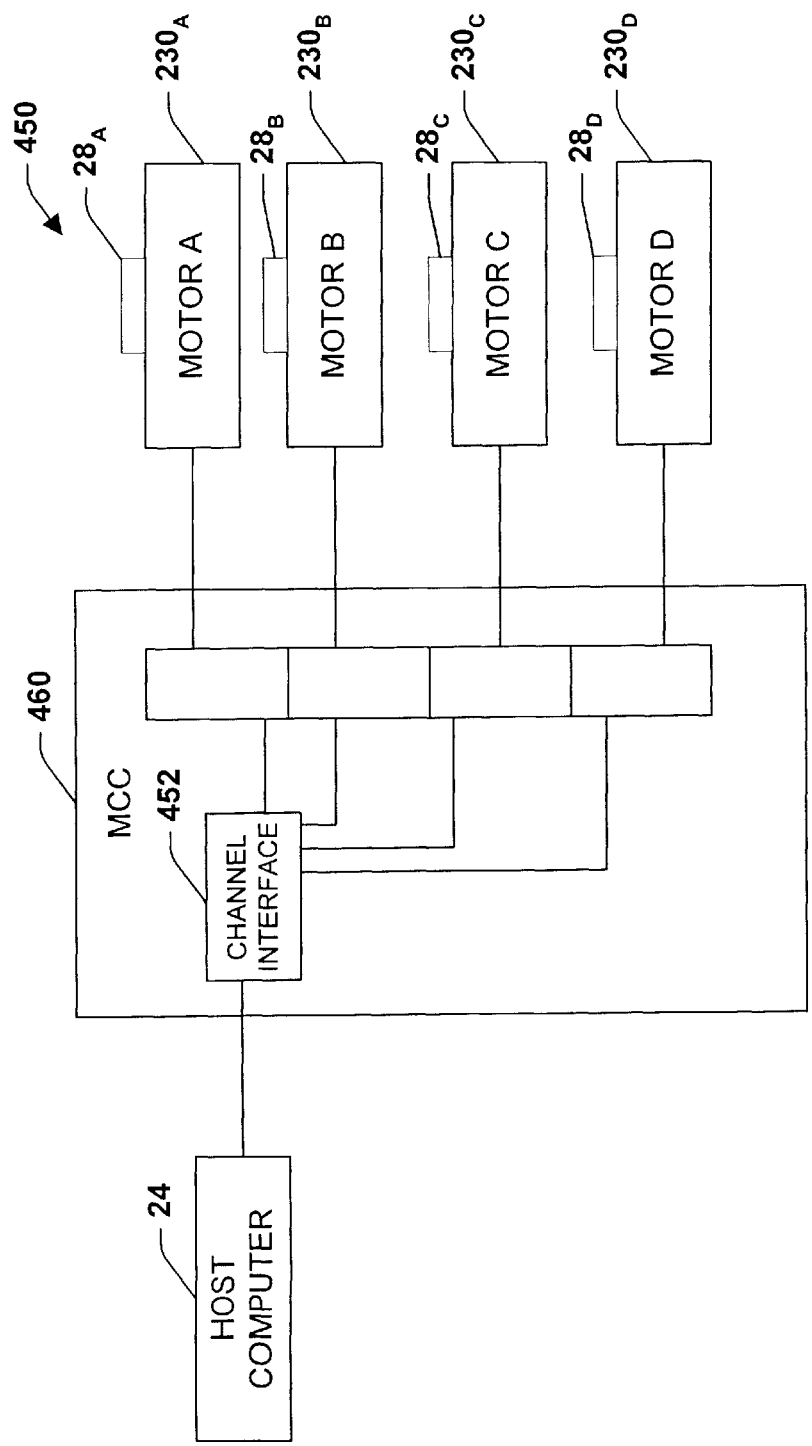
FIG. 24 is a schematic representation of a system for monitoring a plurality of machines in accordance with one specific aspect of the present invention.

Turning now to FIG. 24, the host computer 24 is shown as part of a system 450 where the host computer 24 determines and monitors the health states (using data from diagnostic modules $28_{A-D}$) of a plurality of motors $230_A$–$230_D$ equipped with diagnostic modules $28_{A-D}$, respectively. Although only four motors are shown as part of the system 450, it will be appreciated that virtually any number of motors (or other types of machines where classical machine data analysis can be employed thereon) may be employed in this system 450. The motors $230_A$–$230_D$ are each individually tied to a motor control center 460. Motor control centers are often used with industrial-rated electric motors to start, control and protect the electric motors and their associated electric circuitry. The motor control center 460 contains motor starters to start and stop the motors $230_A$–$230_D$ along with circuit breakers to protect the electric motors and electric wiring. Each respective motor $230_A$–$230_D$ has current sensor(s) coupled to its respective lead wire(s) to obtain current signal data, vibrations sensors 291, temperature sensors 320, encoders 324, and voltage sensors 330. The various sensor data is conditioned, discretized and processed in the manner as described above with reference to FIG. 19. The processed motor data 320 for each motor $230_A$–$230_D$ (FIG. 24) is applied to a channel interface 452 via the respective diagnostic modules $28_A$–$28_D$. The channel interface 452 includes a separate channel for each motor of the system 450. The channel interface 452 is coupled to the host computer 24.

The host computer 24 cycles through each channel at predetermined intervals to obtain data with respect to each motor $230_A$–$230_D$. The host computer 24 then essentially carries out the same steps as described above to determine the states of the motors $230_A$–$230_D$. The advantage of this system 450 is that it allows for the analysis of a plurality of motors by a single computer 24. In this way, a user of the host computer 24 could monitor and analyze a substantial number of motors or machines within a facility from a single location.

It will also be appreciated that the host computer 24 may be located at a remote facility far away from the motors $230_A$–$230_D$. For example, a manufacturer of motors located in the United States could analyze motors located in a plant in Russia via the above system 450. The host computer 24 being located in the United States could be linked to the channel interface 452 of the MCC 460 via a suitable communication link. The manufacturer having access at his/her end to vast amounts of historical data relating to the particular motors $230_A$–$230_D$ could quickly perform a diagnosis of the state of the machines using the motor data. The manufacturer now knowing what is probably wrong with the motors and what is involved with fixing the motors could then take appropriate measures (e.g., sending a motor expert to the Russian facility with the right repair or replacement equipment) to correct the machinery problems.

By each motor $230_A$–$230_D$ having its own diagnostic module associated therewith, data relating to the health of each motor $230_A$–$230_D$ may be collected and analyzed at substantially the same time. Furthermore, the data reliability is superior to that of conventionally collected data because of the present invention affording for sensors to be permanently installed to the respective motors $230_A$–$230_D$. In addition, the close proximity of the diagnostic modules $28_A$–$28_D$ to the motors $230_A$–$230_D$ provides for less noise to be introduced via sensor wire(s) because the sensor wires are substantially short in length.

The system architecture of the present invention may be suitably coded in JAVA or other cross-platform procedural programming language (e.g., "C"). Java is an object-oriented, distributed secure, architecture neutral language. Java provides for object-oriented design which facilitates the clean definition of interfaces and makes it possible to provide reusable "software ICs." Java has an extensive library of routines for copying easily with TCP/IP protocols like HTTP and FTP. Java applications can open and access objects across a network via URLs with the same ease to which programmers are accustomed to accessing a local file system.

Furthermore, Java has a pointer model that eliminates the possibility of overwriting memory and corrupting data. Instead of pointer arithmetic that is employed in many conventional systems, Java has true arrays. This affords for subscript checking to be performed. In addition, it is not possible to turn an arbitrary integer into a pointer by casting.

Java affords for the support of applications on networks. Networks are composed of a variety of systems with a variety of CPU and operating system architectures. To enable a Java application to execute anywhere on the network, a compiler generates an architecture neutral object file format— the compiled code is executable on many processors, given the presence of the Java runtime system. Thus, Java is useful not only for networks but also for single system software distribution. Java affords for the present invention to be platform independant (e.g., the same version of the application runs on all platforms). That is the present invention can be run on substantially all computers—the same applet (a program designed to be delivered through a browser) can work on a Macintosh, a Windows 95 machine, a Sun workstation, etc. To effect such multiplatforming, a network connection and a network browser (not shown) such as Netscape Navigator or Microsoft Internet Explorer may be used in at least one embodiment of the present invention. A Java compiler generates bytecode instructions which have nothing to do with a particular computer architecture. Rather, they are designed to be both easy to interpret on any machine and easily translated into native machine code on the fly.

Being architecture neutral, the "implementation dependent" aspects of the system are reduced or eliminated. A Java interpreter can execute Java bytecodes directly on any machine to which the interpreter has been ported. Since linking is a more incremental and lightweight process, the development process can be much more rapid and exploratory. As part of the bytecode stream, more compile-time information is carried over and available at runtime.

Although the present invention is described with respect to employing Java, it will be appreciated that any suitable programming language may be employed to carry out the present invention.

Furthermore, the present invention may be carried out via an object-oriented architecture. Object oriented programming shifts the emphasis of software development away from function decomposition and towards the recognition of units of software called "objects" which encapsulate both data and functions. Object Oriented Programming (OOP) objects are software entities comprising data structures and operations on data. Together, these elements enable objects to model virtually any real-world entity in terms of its characteristics, represented by its data elements, and its behavior represented by its data manipulation functions. In this way, objects can model concrete things like people and computers, and they can model abstract concepts like numbers or geometrical concepts.

The use of object oriented programming provides for a framework approach to informatics application development. The present invention employs abstract classes, which are designs of sets of objects that collaborate to carry out a set of responsibilities. Thus, a framework is a set of objects classes which collaborate to execute defined sets of computing responsibilities. From a programming standpoint, frameworks are essentially groups of interconnected object classes that provide a prefabricated structure of a working application.

By having a framework for the present invention be based on object-oriented technology, the behavior of the framework can be inherited and overridden to allow developers to extend the framework and create customized solutions in the machine diagnostics arena. As a result, significant advantages are achieved over employing conventional programming techniques used in the machine diagnostics area since a programmer is not required to change original code but rather extending the software. Moreover, the developers no longer have to work blindly through layers of code because the framework provides architectural guidance and modeling and also frees the programmers to supply specific actions unique to the machine diagnostics domain.

One skilled in the art would be able from the description herein to carry out the present invention as platform independent and/or object oriented based and therefore further discussion related thereto is omitted for sake of brevity.

Figure 25:
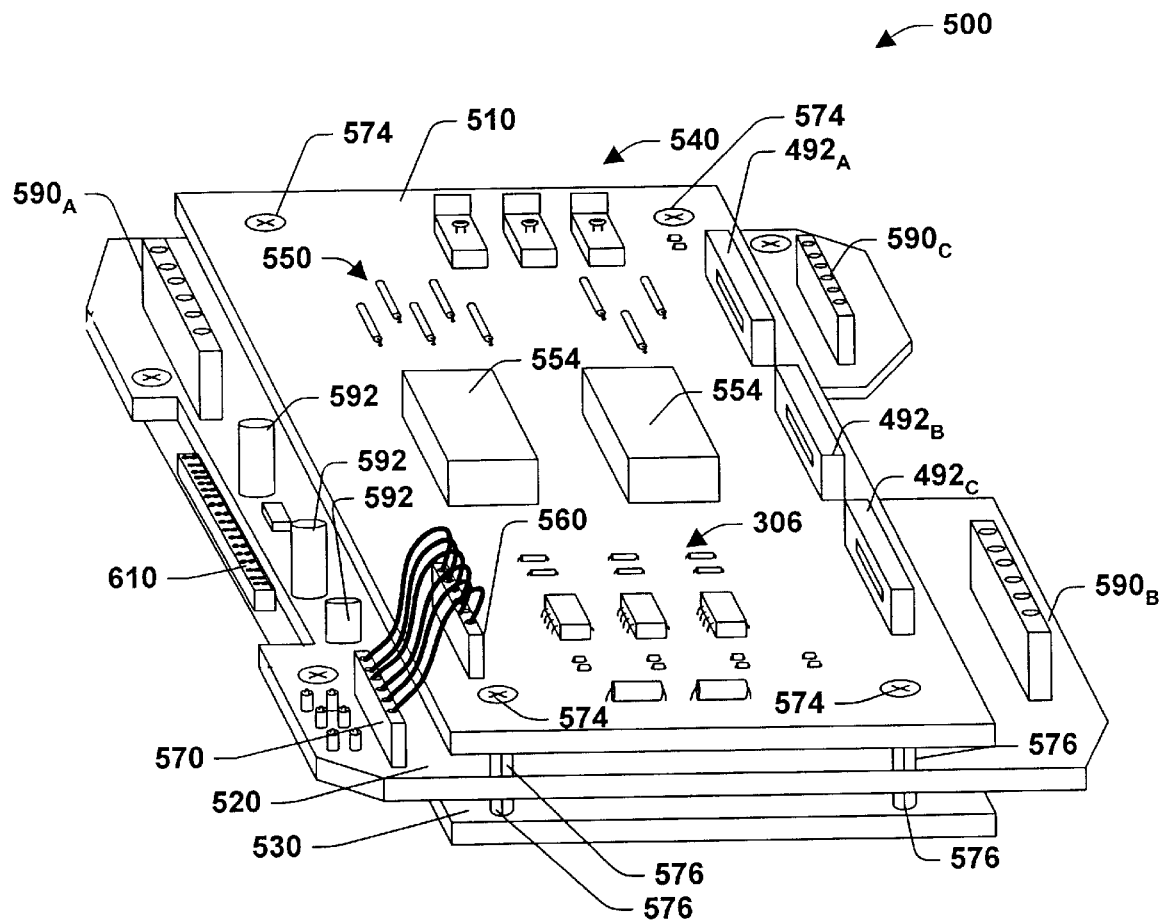
FIG. 25 is a detailed perspective illustration of a stacked circuit board arrangement of a diagnostic module in accordance with one specific aspect of the present invention.

Turning now to FIG. 25, a detailed perspective illustration of a stacked circuit board arrangement 500 of the diagnostic module 28 is shown in accordance with one specific aspect of the present invention. The stacked circuit board arrangement 500 includes a power board 510 located on the top of the stack 500, an analog to digital (A/D) converter board 520 below the power board 510, and a processor/memory board 530 below the A/D board 520. Although, the present invention is primarily described herein employing three stacked circuit boards, it is to be appreciated that all of the functions performed by the three boards may be carried out using simply one board, or two boards or four or more boards. Thus, the number of boards employed to carry out the present invention is not critical to the invention and therefore should not be construed as limiting. In other words, any suitable number of circuit board(s) may be employed to carry out the present invention and are intended to fall within the scope of the invention as defined by the hereto appended claims.

The power board 510 includes 3 contacts 540 for receiving 3-phase input power from the power lead wires 299 to supply power to the motor 230. Wires are also taken off the contacts 540 and run to the motor 230 to power it. The wires run to the motor are first run through the current sensors $492_A$–$492_C$, respectively, one phase wire per current sensor 492.

The power board 510 also includes a resistive divider network 550 for stepping down the voltage of the input power for powering low voltage instrumentation and serving as a motor voltage sensor. The resistive divider network 550 also includes two step down transformers 554. The power board also includes the signal conditioning system 306 (described above with respect to FIGS. 18 and 19). A signal connector 560 provides for sending the analog signals of the power board 510 to the A/D board 520.

The signal connector 560 is shown wired to a signal connector 570 of the A/D board 520. In this manner, the analog signals (e.g., current sensor 492 signals) of the power board 510 to the A/D board for conversion to digital form. The power board 510, the A/D board 520 and the processor/memory board 530 are secured together via screws 574 and bolts 576.

The A/D board 520 includes ports $590_A$–$590_C$ for receiving analog signals from the encoder 324, temperature sensors 320 and vibration sensors 291, respectively. As discussed above, with respect to FIG. 19, the A/D board converts the analog signals from the various sensors into digital form in order to facilitate processing thereof by the processor 52. Components of greater height (e.g., ports $590_A$–$590_C$ and capacitors 592) of the A/D board 520 are placed along the outer perimeter of the A/D board 520 so as not to come into contact with the power board 510. In other words, by arranging A/D board components of low height so as to be directly underneath the power board and A/D board components of high height around the power board, both boards 510 and 520 can be positioned closer together along a vertical axis.

Likewise, a communications port 610 of the processor/memory board 530 is placed along the outer perimeter of the processor/memory board 530 in order to optimize spacing the boards along the vertical axis. A communications card 620 (FIG. 32) plugs into the communications port and provides for interfacing of the diagnostic module 28 with other devices in the manner described above.

Figure 26:
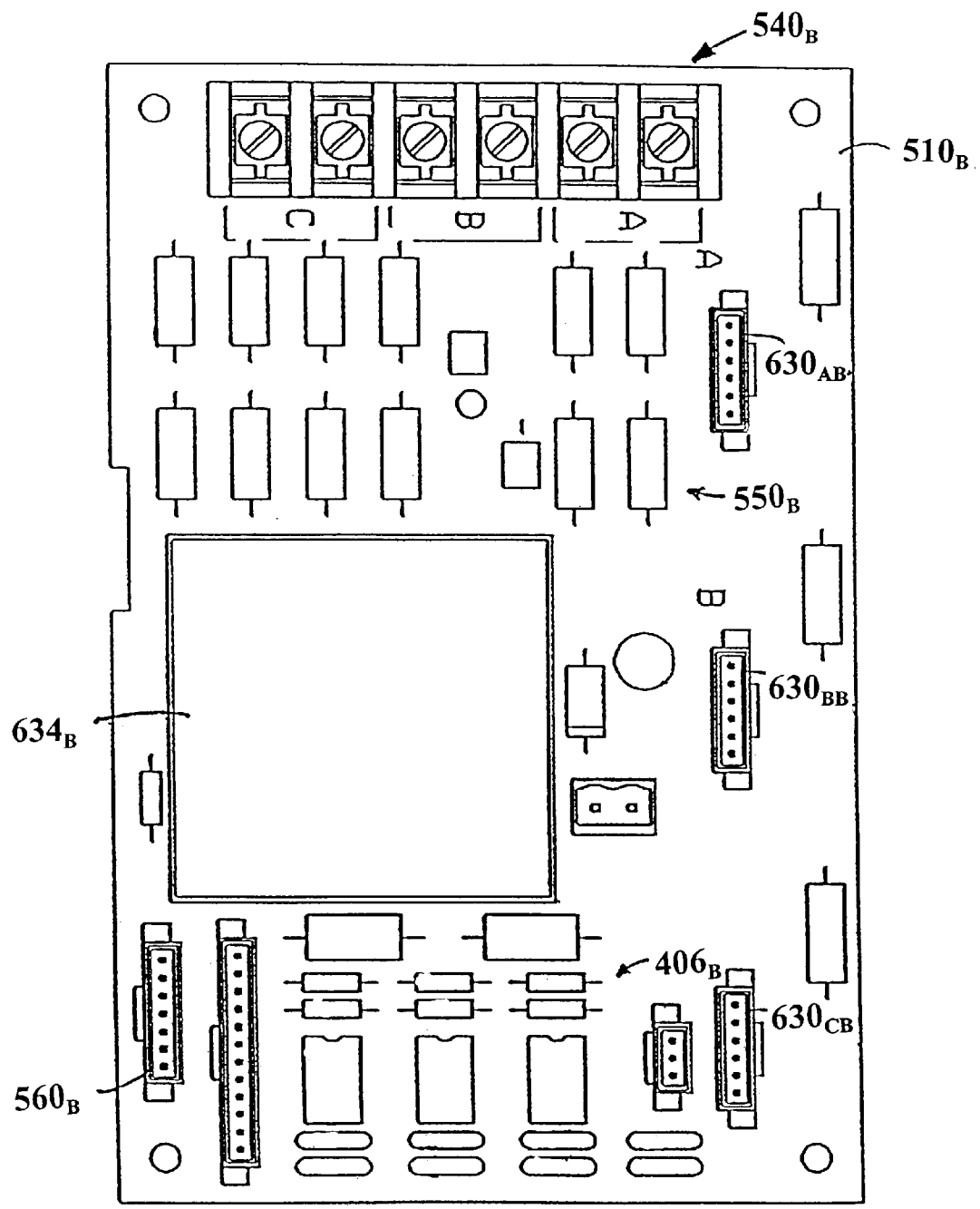
FIG. 26 is a plan view of a power board including current sensor contacts and an independent low voltage power supply in accordance with one specific aspect of the present invention.

FIG. 26 is a plan view of an embodiment of the power board $510_B$ which includes six contacts for power leads (three incoming and three outgoing). This power board is preferably employed for larger motors which have larger lead wires. This power board $510_B$ also does not include current sensors thereon because motors of large horse power typically require proportionately large current sensors. Accordingly, the power board $510_B$ includes current sensor contacts $630_{AB}$–$630_{CB}$. The power board $510_B$ includes an independent low voltage power supply $634_B$ (e.g., 24V DC). As a result, low voltage instrumentation can remain in operation even when motor supply power is shut off. Like parts between the power boards shown in FIGS. 25 and 26 include like reference numerals and further discussion related thereto is omitted for sake of brevity.

Figure 27:
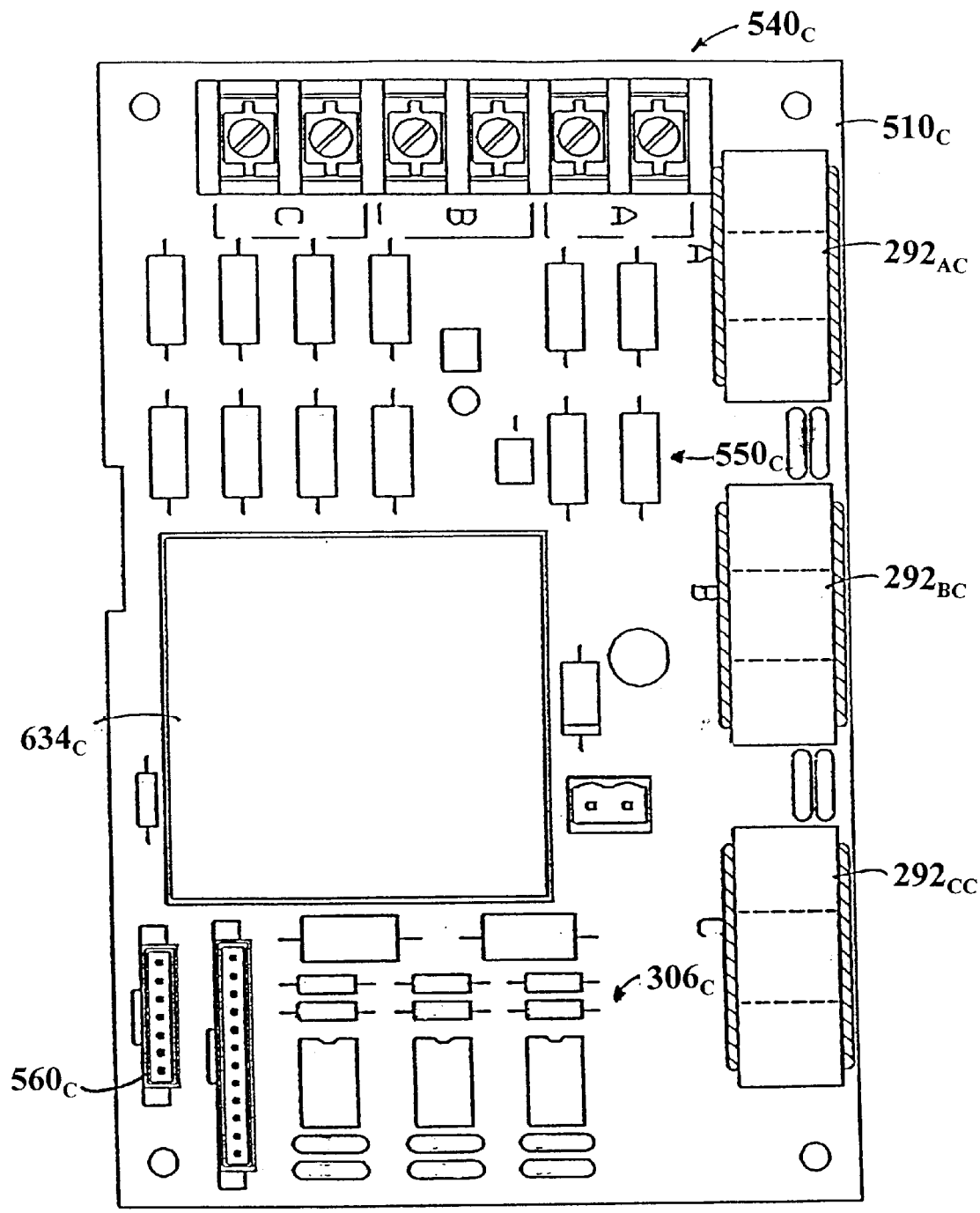
FIG. 27 is a plan view of a power board including current sensors and an independent low voltage power supply in accordance with one specific aspect of the present invention.

FIG. 27 is a plan view of another embodiment of the power board $510_C$. The power board includes six contacts $540_C$ for power leads (three incoming and three outgoing). This power board $510_C$ also includes current sensors $292_{AC}$–$292_{CC}$ thereon. The power board $510_C$ includes an independent low voltage power supply $634_C$. As a result, low voltage instrumentation can remain in operation even when motor supply power is shut off. Like parts between the power boards shown in FIGS. 25 and 27 include like reference numerals.

Figure 28:
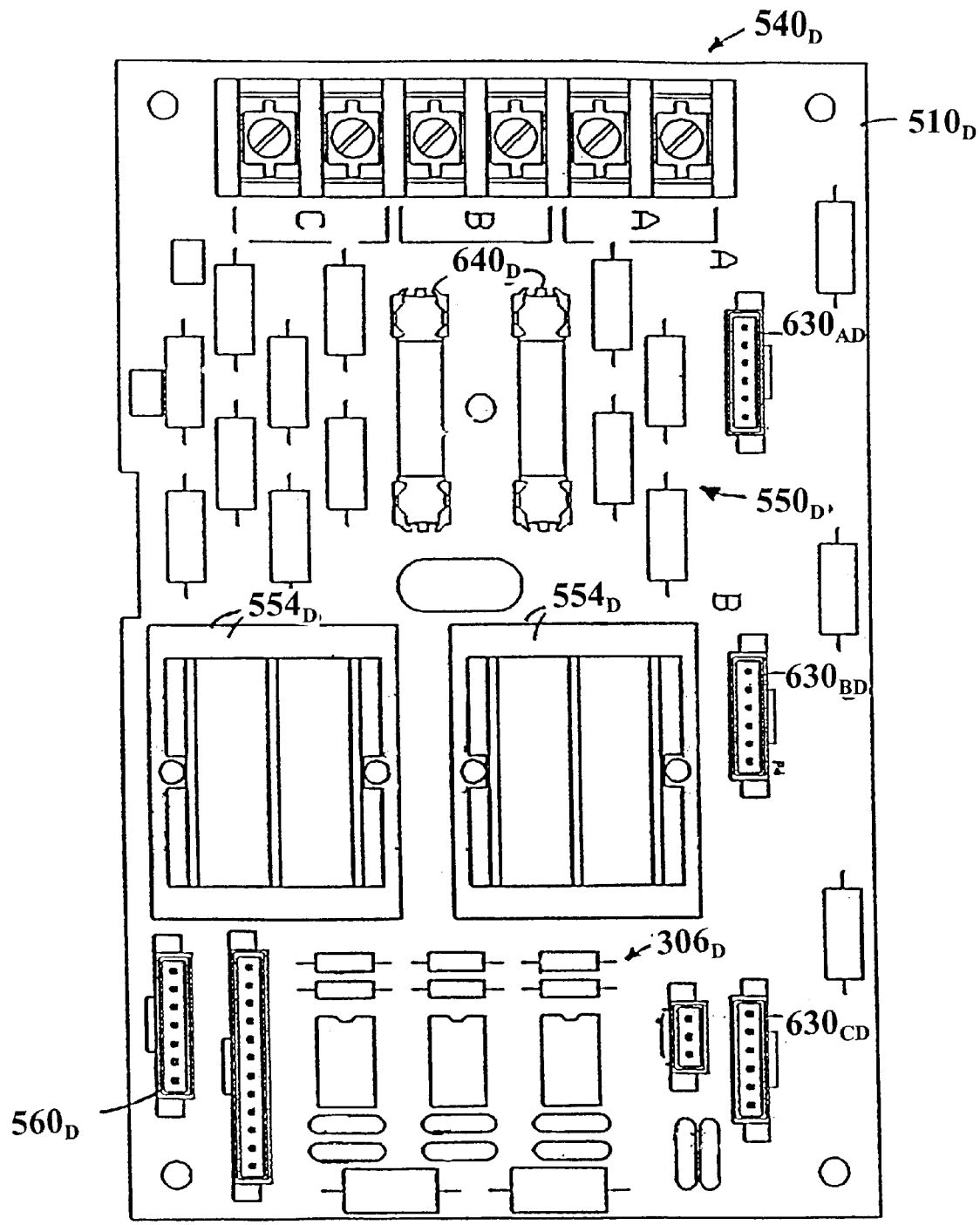
FIG. 28 is a plan view of a power board including current sensor contacts and step down transformers in accordance with one specific aspect of the present invention.

FIG. 28 is a plan view of yet another embodiment of the power board $510_D$. The power board includes six contacts $540_D$ for power leads (three incoming and three outgoing). This power board $510_D$ does not include current sensors thereon. Instead, the power board includes current sensor contacts $630_{AD}$–$630_{CD}$. The power board $510_D$ includes fuses $640_D$ for protecting the power board $510_D$ from overvoltage and/or overcurrent problems. Like parts between the power boards shown in FIGS. 25 and 28 include like reference numerals.

Figure 29:
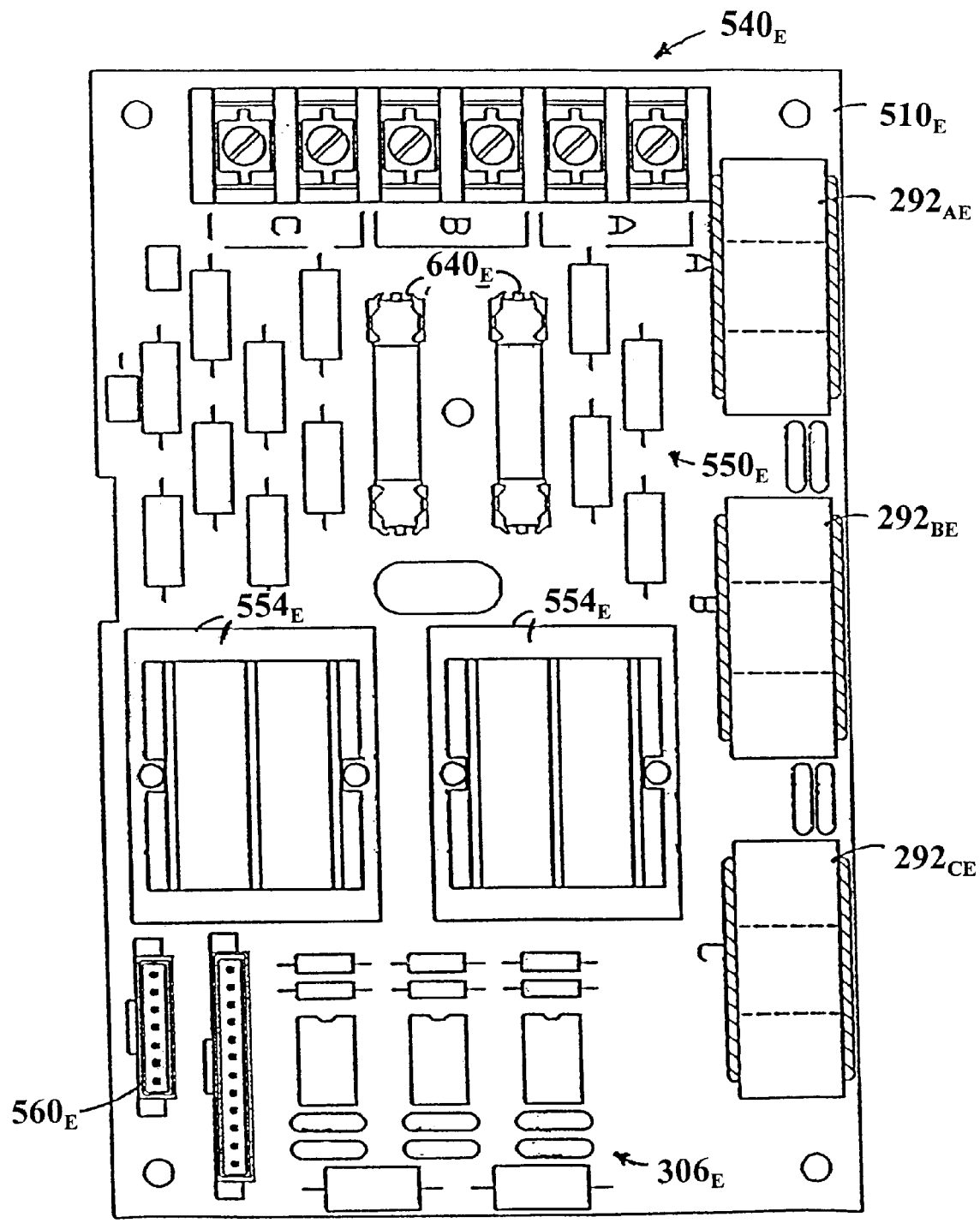
FIG. 29 is a plan view of a power board including current sensors and step down transformers in accordance with one specific aspect of the present invention.

FIG. 29 is a plan view of still yet another embodiment of the power board $510_E$. The power board $510_E$ includes six contacts $540_E$ for power leads (three incoming and three outgoing). This power board $510_E$ does include current sensors $292_{AE}$–$292_{CE}$ thereon and includes fuses $640_E$ for protecting the power board $510_E$ from overvoltage and/or overcurrent problems. Like parts between the power boards shown in FIGS. 25 and 29 include like reference numerals.

Figure 30:
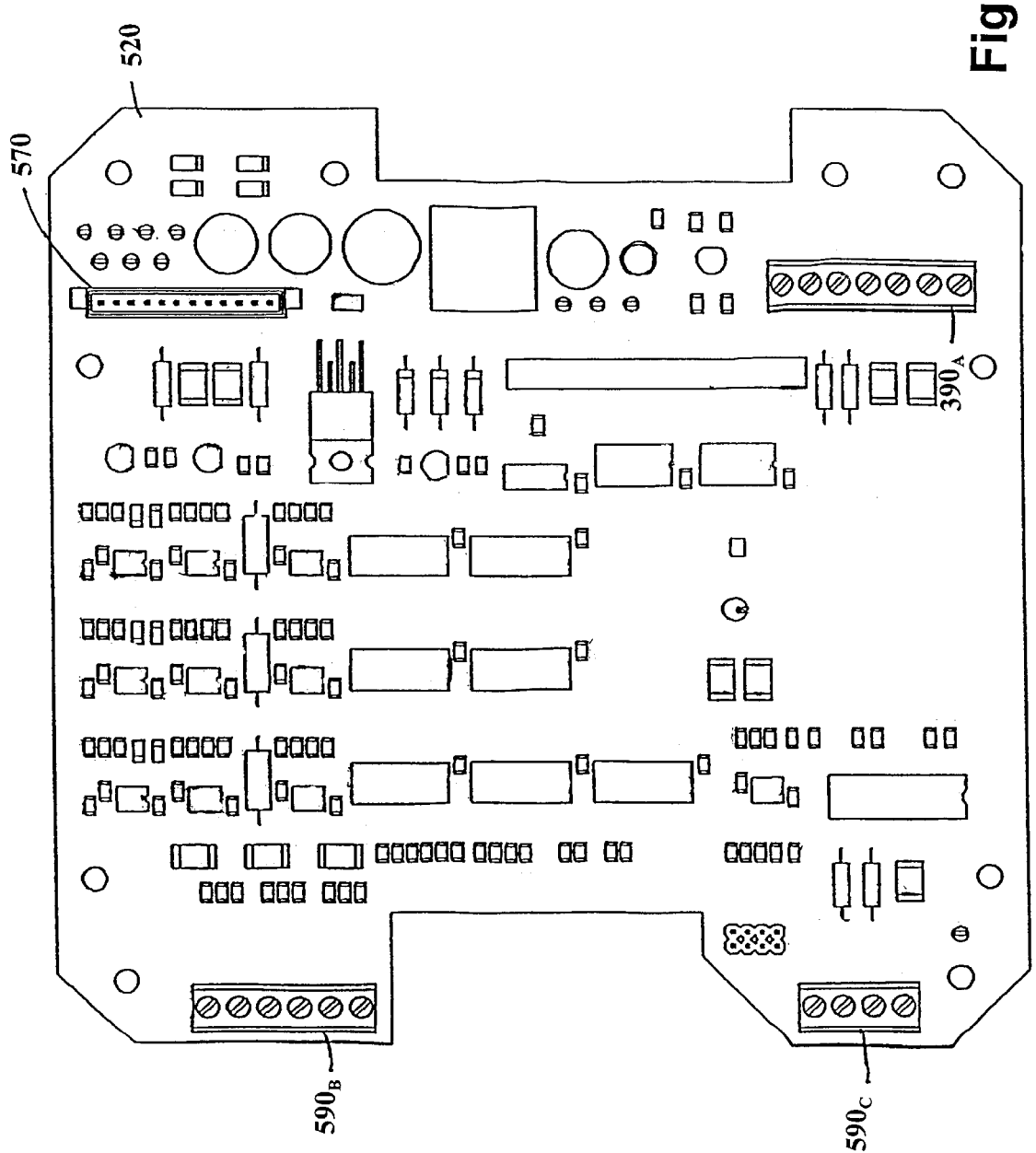
FIG. 30 is a plan view of an analog to digital converter board in accordance with one specific aspect of the present invention.

FIG. 30 is a plan view of the analog to digital converter board 520 of FIG. 25.

Figure 31:
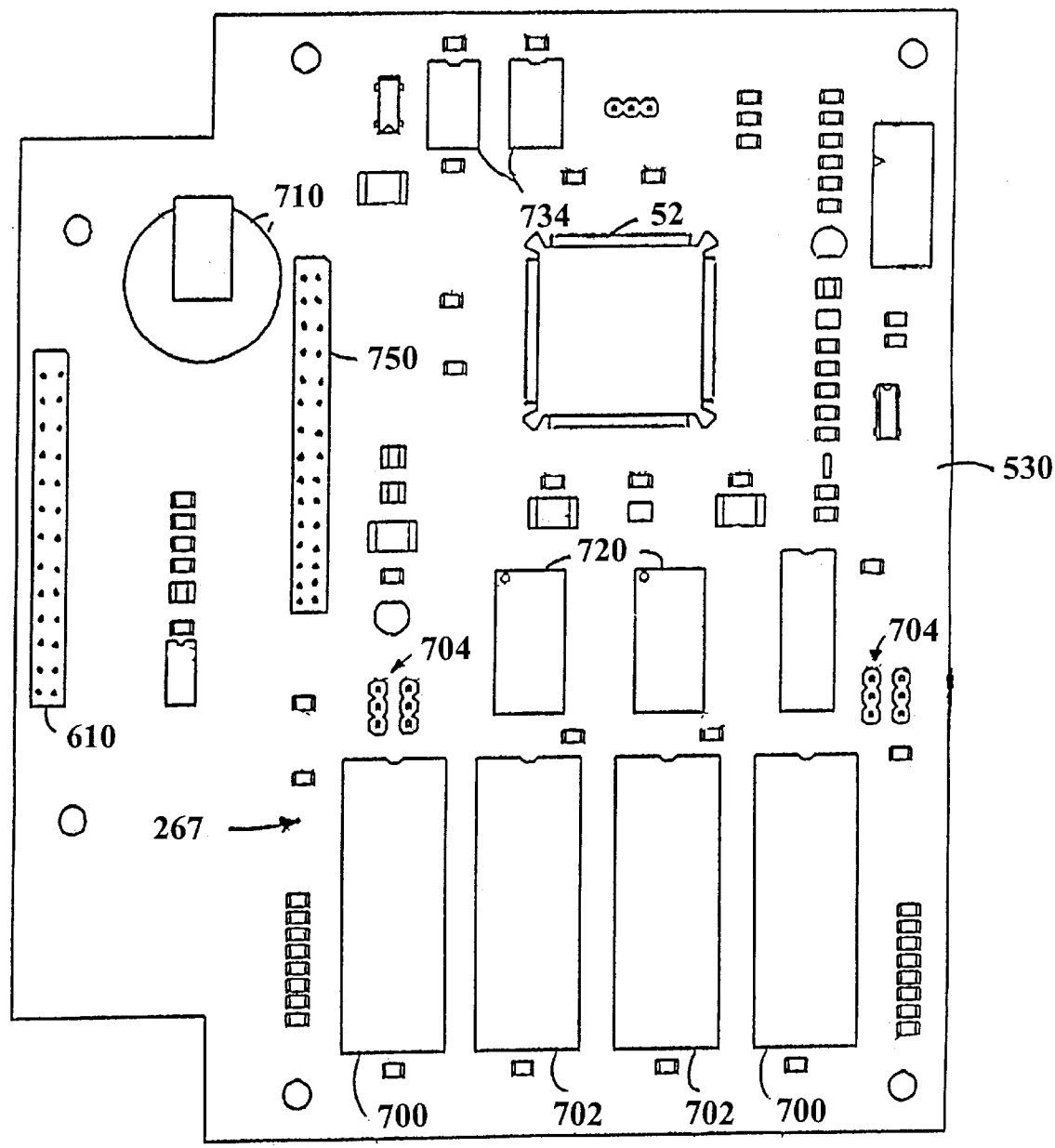
FIG. 31 is a plan view of a processor and memory board in accordance with one specific aspect of the present invention.

FIG. 31 is a plan view of the processor/memory board 530 of FIG. 25. The processor/memory board 530 includes ROM 700, static RAM 702 and flash memory 704. The processor/memory board 530 also includes the microprocessor 52 discussed in substantial detail above. A backup battery 710 serves as a temporary power source. The processor/memory board 530 includes clocks 720. The processor/memory board 530 further includes an encoder interface chip 730 and on-board temperature sensors 734. A port 750 receives pins protruding from the underside of the A/D board 520 so as to establish an operative connection between the two boards for transmission of digital data from the A/D board to processor/memory board 530. The operation of the processor 52 and the memory 267 is discussed in substantial detail above and thus further discussion related thereto is omitted in order to avoid redundancy.

Figure 32:
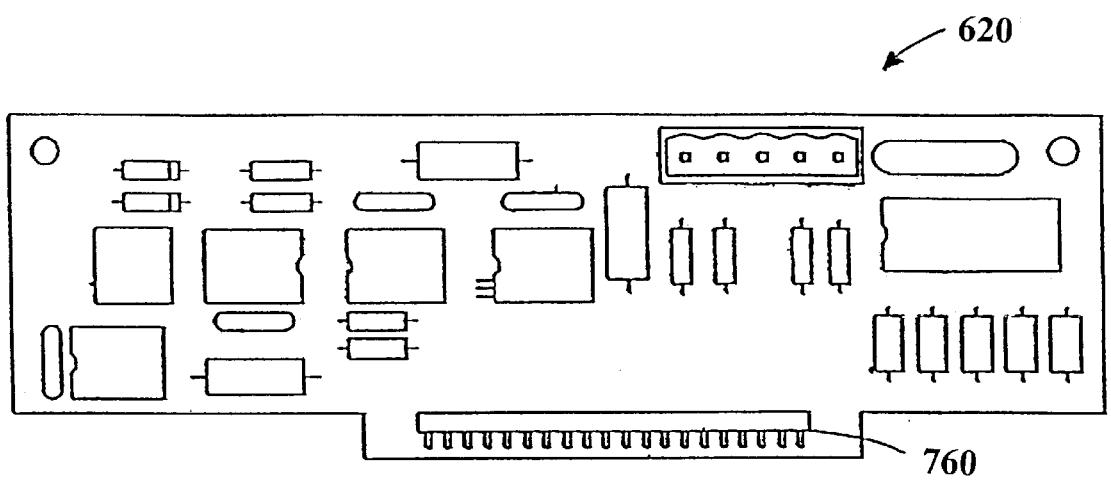
FIG. 32 is a plan view of a data communications board in accordance with one specific aspect of the present invention.

FIG. 32 is a plan view of a communications card 620 (e.g., RS 232 interface). The communications card 620 includes a set of pins 760 which plug into the port 610 of the processor/memory board 530. The functions of the communications card 620 are discussed in significant detail above with respect to the data communications 264 of FIGS. 17a–19.

Thus, the diagnostics module 28 provides for an integrated diagnostic device for determining the health of a dynamoelectric machine. The integrated diagnostic module affords for autonomous collection and processing of substantial types of data relevant to the health of a dynamoelectric machine. Since the diagnostic module 28 is specific to a single machine, sensors can be permanently mounted to the machine and connected to the diagnostic module which improves data reliability. Furthermore, since the diagnostic module 28 is machine specific the data can be sampled continuously or at accelerated intervals as compared to once per month using conventional portable readers. Such accelerated sampling allows for more reliable trend analysis and forecasting (e.g., maintenance scheduling and failure prediction). Additionally, the close proximity of the diagnostic module to the sensors collecting data relating to the health of the machine affords for short sensor wire lengths which reduces chances of noise being introduced through the sensor wires. Moreover, the present invention affords for autonomous determination of the health of a machine using very sophisticated diagnostic techniques (e.g., vibration signature analysis; current signature analysis; motor temperature analysis; motor voltage analysis; and motor shaft rotation analysis).

The present invention affording for combining several machine diagnostic techniques together at the site of the motor affords for highly accurate diagnosis as well as trend analysis, machine failure prediction, etc.

Furthermore, the system architecture of the present invention affords for the ability to communicate with a machine automatically on-line through a distributed network. As a result, data collections can be scheduled and the data moved to a memory where software tools can easily access the data to perform machine diagnostics and trend analysis. Thus, the present invention affords for on-line diagnosis of a plurality of machines within the system by providing the numerous analytical tools described herein, the ability to automatically determine communications protocol being used, selecting from displaying different types of data sets (e.g., single data, trend data) and to be able to diagnose the health state of an entire process line.

It is to be appreciated that the present invention may be applied to a wide variety of machines (e.g., induction motors, DC motors, DC synchronous motors, AC synchronous motors, and motors driven via inverters and motors driven vis SCR soft starts) and combinations thereof.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A machine diagnostic system, including:
    a host computer for determining a health state of a machine, the host computer being operatively coupled to a network backbone;
    a machine diagnostic module adapted to be integrally mounted to a machine, the machine diagnostic module being operatively coupled to the network backbone, the machine diagnostic module collecting data relating to operation of the machine;
    a system architecture including a software based analysis layer, the analysis layer providing for preprocessing of the machine data, the analysis layer being operative to facilitate determining positive sequence and negative sequence relating to the machine;
    wherein the host computer analyzes the preprocessed data in making a determination as to the health state of the machine.

2. The machine diagnostics system of claim 1, the analysis layer including an algorithm for producing an FFT of machine vibration data.

3. The machine diagnostics system of claim 1, the analysis layer including an algorithm for producing an FFT of machine current data.

4. The machine diagnostics system of claim 1, the analysis layer being operative to facilitate determining shaft torque and shaft speed of the machine.

5. The machine diagnostics system of claim 1, the analysis layer being operative to facilitate determining machine temperature.

6. The machine diagnostic system of claim 1, the analysis layer being operative to facilitate determining RMS current relating to the machine.

7. The machine diagnostic system of claim 1, the analysis layer being resident on the machine diagnostic module.

8. The machine diagnostic system of claim 1 having a system architecture including a software based communications layer, the communications layer providing for determining a type of communications protocol being employed by the machine diagnostic system, and providing for communication between the host computer and the machine diagnostic module via the commutations protocol.

9. The machine diagnostic system of claim 8, the communications layer being resident on the host computer.

10. The machine diagnostic system of claim 8, the communications layer being resident of the machine diagnostic module.

11. The machine diagnostic system of claim 10, the machine diagnostic module adapted to be removed from a first machine of a first system and coupled to a second machine of a second system, wherein a communications protocol of the first system is different from the second system, the communications layer adapted to provide for communications between the first machine and a host computer of the first system, and the communications layer adapted to recognize the type of communication protocol being employed by the second system and provide for communications between the diagnostic module attached to the second machine and a host computer of the second system.

12. The machine diagnostic system of claim 1 having a system architecture including a memory, the memory adapted to store preprocessed data from the diagnostic module and adapted to have the preprocessed data be retrieved by the host computer.

13. The machine diagnostic system of claim 1 having a system architecture including an expert layer adapted to analyze the preprocessed data and to facilitate determining a health state of the machine.

14. The machine diagnostic system of claim 13, the expert layer being resident on the host computer.

15. The machine diagnostic system of claim 13, the expert layer providing for trending of the preprocessed data so as to trend a health state of the machine.

16. The machine diagnostic system of claim 1 having a system architecture including a process layer, the process layer adapted to analyze the preprocessed data and to facilitate determining a health state of a process employing the machine.

17. The machine diagnostic system of claim 1 having a system architecture that is platform independant.

18. The machine diagnostic system of claim 1 having a system architecture including an object oriented framework.

19. A system for on-line machine diagnosis, comprising:
   a host computer for determining a health state of at least one machine of a plurality of machines, the host computer being operatively coupled to a network backbone;
   a machine diagnostic module adapted to be integrally mounted to the at least one machine, the machine diagnostic module being operatively coupled to the network backbone, the machine diagnostic module including:
      a set of stacked circuit boards, including:
         a power board planarly spaced apart including power supply and power sensor inputs;
         a signal conditioning board, operatively coupled to the power board, being planarly spaced apart and including a vibration sensor port; and
         a processor and memory board operatively coupled to the signal conditioning board and including a microprocessor and memory,
   wherein the machine diagnostic module collects data relating to operation of the at least one machine,
      a system architecture including a software based analysis layer, the analysis layer providing for preprocessing of the machine data and being operative to facilitate determining positive sequence and negative sequence relating to the machine, and wherein the host computer determines a health state of the at least one machine via analyzing the preprocessed data.

20. The system of claim 19 including a system architecture which facilitates machine diagnosis, the system architecture including:
   an analysis layer for preprocessing data collected from the at least one machine;
   a communications layer adapted to provide for communications between the diagnostic module and the host computer; and
   an expert layer for analyzing the preprocessed data and determining a health state of the at least one machine.

21. The system of claim 20, further including a process layer for analyzing preprocessed data from a plurality of machine of a process, the process layer facilitating determining the health state of the process.

22. The system of claim 20, the expert layer operatively coupled to a display, the expert layer providing for displaying the analyzed preprocessed data on the display.

23. The system of claim 22, the expert layer displaying at least one of the following machine related data: (1) machine shaft torque and speed; (2) machine temperature; (3) RMS current; (4) positive and negative sequence; (5) FFT of vibration data; (6) RMS vibration data; (7) FFT of current data; (8) wavelet of vibration data; and (9) wavelet of current data.

24. The system of claim 22, the expert layer generating an icon representative of the at least one machine, the icon being of a first color when the at least one motor is operating within a normal temperature range, the icon being of a second color when the at least one motor is operating within an undesired temperature range; and the icon being of a third color when the motor is overheated.

25. The system of claim 22, the expert layer generating and displaying an icon for each of the plurality of machines, at least one of the icons being of a first color when the icon's respective machine is operating within a normal temperature range, the at least one icon being of a second color when the icon's respective machine is operating within an undesired temperature range; and the at least one icon being of a third color when the respective machine is overheated.

26. A method for diagnosing the health state of a plurality of machines within a system including the steps of:
   using a diagnostic module to collect data from at least one of the plurality of machines;
   using a system architecture including a software based analysis layer to preprocess the collected data, the analysis layer being operative to facilitate determining positive sequence and negative sequence relating to the one of the plurality of machines;
   storing the preprocessed data on a memory;
   using a host computer to retrieve the preprocessed data;
   using the host computer to analyze the preprocessed data to determine a health state of the at least one of the plurality of machines.

27. The method of claim 26, further including the step of using the host computer to determine a health state of a process employing the at least one of the plurality of machines.

28. The method of claim 26, further including the steps of:
   using a software based analysis layer resident on the diagnostic module to perform the preprocessing of the machine data;
   using a software based communications layer to provide for communications between the diagnostic module and the host computer;

using a software based expert layer resident on the host computer to analyze the preprocessed data and determine a health state of the at least one of the plurality of machines.

29. A system for determining a health state of a motor, comprising:

a host computer for determining a health state of at least one motor of a plurality of motors, the host computer being operatively coupled to a network backbone;

a diagnostic module adapted to be integrally mounted to the at least one motor, the diagnostic module being operatively coupled to the network backbone, the diagnostic module collecting data relating to operation of the at least one motor, the diagnostic module being associated with a system architecture layer including a software based analysis layer for preprocessing the data, the analysis layer being operative to facilitate determining positive sequence and negative sequence relating to the machine, the diagnostic module further including a memory adapted to store design data relating to the motor, the diagnostic module storing the preprocessed data and motor design related data, on a system memory wherein the host computer determines a health state of the motor by retrieving the preprocessed data and motor design data from the system memory and analyzing the preprocessed data and motor design related data.

30. A system architecture for employment in a system for diagnosing a health state of a motor, comprising:

an analysis layer for collecting and preprocessing data related to the motor, the analysis layer being operative to facilitate determining positive sequence and negative sequence relating to the motor;

a communications layer for transmitting the preprocessed data over a network;

an expert layer to process the preprocessed data and determine a health state of the motor.

31. The system architecture of claim 30 further including a process layer for determining a health state of a process employing the motor via processing results from the expert layer.

32. A system for determining a health state of a machine, including:

means for collecting and preprocessing data related to the machine, the means for preprocessing data including a system architecture having an analysis layer for preprocessing the data, the analysis layer being operative to facilitate determining positive sequence and negative sequence relating to the machine;

means for communicating at least one of the collected and preprocessed data over a network; and means for receiving and processing the at least one of the collected and preprocessed data over a network and determining a health state of the machine.

33. The system of claim 32 further including means for determining a health state of a process employing the machine.

34. The system of claim 32 further including means for displaying the health state determination of the machine.

35. A system for displaying machine related information, comprising:

a first computer operatively coupled to a machine, the first computer collecting raw data relating to the operation of the machine, the first computer including a system architecture having a software based analysis layer, the analysis layer providing for preprocessing of the raw data and being operative to facilitate determining positive sequence and negative sequence relating to the machine, and storing the preprocessed data on a memory;

a second computer operative to receive the preprocessed data, the second computer being operatively coupled to a display;

wherein the second computer analyzes the preprocessed data and displays on the display at least one of a first visual indicia representative of a first operating condition of the machine and a second visual indicia representative of a second operating condition of the machine.

36. A machine diagnostic module adapted to be integrally mounted to a machine, the machine diagnostic module being operatively coupled to a network backbone, the machine diagnostic module including:

means for collecting machine related data;

means for preprocessing at least a portion of the machine related data, the means for preprocessing data including a system architecture having an analysis layer for preprocessing the machine related data, the analysis layer being operative to facilitate determining positive sequence and negative sequence relating to the machine;

means for storing the machine related data and the preprocessed data; and means for determining the health of the at least one machine based on the machine related data and preprocessed data.

* * * * *